United States Patent [19]

Hayashi et al.

[11] Patent Number: 5,576,571
[45] Date of Patent: Nov. 19, 1996

[54] SEMICONDUCTOR MEMORY CELL HAVING INFORMATION STORAGE TRANSISTOR AND SWITCHING TRANSISTOR

[75] Inventors: Yutaka Hayashi; Takeshi Matsushita, both of Kanagawa, Japan

[73] Assignee: Sony Corporation, Tokyo, Japan

[21] Appl. No.: 541,173

[22] Filed: Oct. 11, 1995

Related U.S. Application Data

[62] Division of Ser. No. 420,068, Apr. 11, 1995, Pat. No. 5,506,436, which is a division of Ser. No. 164,812, Dec. 10, 1993, Pat. No. 5,428,238.

[30] Foreign Application Priority Data

Dec. 10, 1992 [JP] Japan ..................................... 4-352200
May 7, 1993 [JP] Japan ..................................... 5-130130
Sep. 7, 1993 [JP] Japan ..................................... 5-246264

[51] Int. Cl.[6] .......................... H01L 29/76; H01L 29/94; H01L 31/062; H01L 31/113
[52] U.S. Cl. ........................... 257/369; 257/401; 257/476
[58] Field of Search ..................................... 257/369, 401, 257/476

[56] References Cited

U.S. PATENT DOCUMENTS

| | | |
|---|---|---|
| 4,330,849 | 5/1982 | Togei et al. . |
| 4,384,300 | 5/1983 | Iizuka . |
| 5,283,457 | 2/1994 | Matloubian ............................. 257/351 |
| 5,315,143 | 5/1994 | Tsuji ...................................... 257/351 |

*Primary Examiner*—Ngân V. Ngô
*Attorney, Agent, or Firm*—Hill, Steadman & Simpson

[57] ABSTRACT

A semiconductor memory cell, or a semiconductor memory cell for ASICs, of the structure is provided which ensures stable transistor operation, which does not require a large-capacitance capacitor as required in conventional DRAMs, which ensures reliable reading and writing of information, that permits short-channel design, and that allows the cell area to be reduced. The semiconductor memory cell includes: an information storage transistor $TR_1$ comprising a semiconductor channel layer $Ch_1$, first and second conductive gates $G_1$, $G_2$, and first and second conductive layers $L_1$, $L_2$; and a switching transistor $TR_2$ comprising a semiconductor channel forming region $Ch_2$, a third conductive gate $G_3$, and third and fourth conductive layers $L_1$, $L_4$, wherein the fourth conductive layer $L_4$ is connected to the second conductive gate $G_2$, the first conductive gate $G_1$ and the third conductive gate $G_3$ are connected to a first memory-cell-selection line, the first conductive layer $L_1$ and the third conductive layer $L_3$ are connected to a second memory-cell-selection line, the second conductive layer $L_2$ is connected to a fixed potential, and the semiconductor channel forming region $Ch_2$ is connected to a read/write selection line.

5 Claims, 13 Drawing Sheets

5,576,571

SEMICONDUCTOR MEMORY CELL HAVING INFORMATION STORAGE TRANSISTOR AND SWITCHING TRANSISTOR

This is a divisional of application Ser. No. 08/420,068, filed Apr. 11, 1995 now U.S. Pat. No. 5,506,436, which is a divisional application of 08/164,812, filed Dec. 10, 1993, now U.S. Pat. No. 5,428,238.

BACKGROUND OF THE INVENTION

1. Field of the Invention

The present invention relates to a semiconductor memory cell consisting of two transistors or one transistor formed by combining two transistors.

2. Description of the Prior Art

FIG. 17 shows a conventional dynamic memory cell consisting of a single transistor and a capacitor; the memory cell of this structure is generally known as a one-transistor memory cell and used as a semiconductor memory cell suitable for high density devices. In such a memory cell, the capacitance of the capacitor needs to be high enough to cause a voltage change on the associated bit line. However, the trend to smaller plan area of the semiconductor memory cell necessitates a reduction in the size of the capacitor formed in a horizontal plate-like shape, giving rise to the problem that when reading information stored as a charge on the memory cell capacitor, the information is masked by noise, or that, because of increasing stray capacitance on the bit line with each generation of memory cells, only a small voltage change can be caused to the bit line. In one approach to solving this problem, there is proposed a dynamic memory cell having a trench capacitor cell structure (see FIG. 18) or a stacked capacitor cell structure. However, because of processing limitations on how deep the trench can be formed and how high the stack (stacked layers) can be made, there is a limit to increasing the capacitance of the capacitor. Accordingly, it is said that dynamic memory cells of these structures encounter the limit of miniaturization in the dimensional region beyond the low submicron rule.

Furthermore, with transistors forming the semiconductor memory cells, reducing the transistor's plan area beyond the low submicron rule would introduce such problems as dielectric strength degradation, punch-through, etc., which would increase the possibility of leakage even under the rated voltage condition. With conventional transistor structures, therefore, it becomes difficult to ensure proper operation of the memory cell when the memory cell size is reduced.

To overcome the above limitations on the capacitance, there is proposed a memory cell structure wherein the memory cell is constructed with two transistors and the transistor channel current is sensed.

In the memory cell disclosed in Japanese Patent Unexamined Publication No. 63-19847, for example, a capacitor $C_2$ coupled to the gate and drain of a MOS transistor $Q_1$ is connected to a word line, as shown in FIG. 3 accompanying the same Patent Publication. Furthermore, the drain of the transistor $Q_1$ is connected to the gate of an SOI transistor $Q_2$ of the complementary type to the transistor $Q_1$. The drain of the transistor $Q_2$ is in turn connected to a fixed potential $V_D$, while the source of each of the transistors, $Q_1$ and $Q_2$, is connected to a bit line.

In the memory cell disclosed in the above Patent Publication, since the gate electrode of the SOI (silicon-on-insulator) transistor $Q_2$ is formed only on one principal surface side of the channel region thereof having two principal surfaces, an extra capacitor $C_2$ is needed to complete the structure of the memory cell. A further problem is that because of the charge or electric field applied (through an insulating film) to the other principal surface of the channel region of the SOI transistor $Q_2$, the operation of the SOI transistor $Q_2$ becomes unstable and it is difficult to reduce the channel length.

On the other hand, the memory cell disclosed in Japanese Patent Unexamined Publication No. 1-145850 is constructed with a write transistor 18, a read transistor 19 (an SOI transistor), and a protective capacitor 20, as shown in FIG. 1 accompanying the same Patent Publication. The source of the write transistor 18 is connected to the gate of the read transistor 19. The cathode of the protective diode 20 is connected to the drain of the read transistor 19. Further, the anode of the protective diode 20 and the drain of the write transistor 18 are connected to a bit line, while the source of the read transistor 19 and the gate of the write transistor 18 are connected to a word line.

In the memory cell disclosed in the above Patent Publication, since the read transistor 19 is an SOI transistor, when the source potential is caused to change to the same polarity as the gate potential (when writing a "1") the potential of the channel region changes with the change of the gate potential, resulting in an incomplete writing condition. It is therefore difficult to read the "1" with the expected certainty. Furthermore, in the read transistor 19, the gate electrode is formed only on one principal surface side of the channel region having two principal surfaces. Therefore, this structure also has the problem that because of the charge or electric field applied (through an insulating film) to the other principal surface side of the channel region of the read transistor 19, the operation of the read transistor 19 becomes unstable and it is difficult to reduce the channel length.

The memory cells disclosed in Japanese Patent Unexamined Publication Nos. 62-141693 and 62-254462 each comprise a write transistor T1, a read transistor T2, and a storage capacitor C, as shown in FIG. 1 accompanying the former Patent Publication. The drains of the transistors T1 and T2 are connected to a bit line, and the source of the transistor T1 is connected to the storage capacitor and also to a first gate of the transistor T2. Further, the gate of the transistor T1 is connected to a write selection line, while a second gate (or a channel forming region such as a well) of the transistor T2 is connected to a read selection line.

When the read transistor T2 is formed from an SOI transistor, the first and second gates are respectively formed on the upper and lower surface sides of the channel region of the transistor T2 (refer to Japanese Patent Application No. 55-93521 and Japanese Patent Unexamined Publication No. 57-18364). This structure eliminates the problem that has placed a limitation on the reduction of the channel length. For the write transistor T1, on the other hand, only bulk-type transistors are disclosed as preferred embodiments, and therefore, there is a limit to the miniaturization of the memory cell as a whole. Furthermore, the structure requiring each word line to be divided into a read line and a write line has the problem of increased chip area or increased number of stacked layers.

The present invention is concerned with the structure of a memory cell constructed with two transistors and yet capable of solving the above enumerated problems. An object of the invention is to provide a semiconductor memory cell, a semiconductor memory cell for ASICs (Application Specific Integrated Circuits), and even a semiconductor memory cell with a single transistor formed by combining two transistors, of the structure that ensures stable transistor operation, that does not require the provision of a large-capacitance capacitor as required in prior art DRAMs, and that allows the channel length to be reduced and achieves miniaturization of the cell.

SUMMARY OF THE INVENTION

To achieve the above object, in accordance with a first aspect of the invention, there is provided a semiconductor memory cell, as shown in the schematic diagram of FIG. 1, comprising:

an information storage transistor $TR_1$ comprising a semiconductor channel layer $Ch_1$ having first and second opposing principal surfaces; first and second conductive gates, $G_1$ and $G_2$, respectively disposed opposite the two principal surfaces of the semiconductor channel layer $Ch_1$ with first and second barrier layer respectively interposed therebetween; and first and second conductive regions, $L_1$ and $L_2$, respectively connected to either end of the semiconductor channel layer $Ch_1$, and a switching transistor $TR_2$ comprising a semiconductor channel forming region $Ch_2$ having a third principal surface; a third conductive gate $G_3$ disposed opposite the third principal surface of the semiconductor channel forming region $Ch_2$ with a third barrier layer interposed therebetween; and third and fourth conductive layers, $L_2$ and $L_4$, each formed in a surface region of the semiconductor channel forming region $Ch_2$ and near either end of the third conductive gate $G_3$, wherein the fourth conductive layer $L_4$ is connected to the second conductive gate $G_2$, the first conductive gate $G_1$ and the third conductive gate $G_3$ are connected to a first memory-cell-selection line, the first conductive layer $L_1$ and the third conductive layer $L_3$ are connected to a second memory-cell-selection line, the second conductive layer $L_2$ is connected to a fixed potential including zero potential, and the semiconductor channel forming region $Ch_2$ is connected to a read/write selection line.

In the above structure, the conductive layers may be formed from a low-resistivity semiconductor, a silicide, a two-layered structure of silicide and semiconductor, a metal, or the like. The barrier layers serve as barriers to channel carriers, and may be formed from an insulating material or a wide-gap semiconductor material.

In one preferred mode of the semiconductor memory cell according to the first aspect of the invention, as shown in the schematic diagram of FIG. 4, the information storage transistor $TR_1$ is formed from a transistor of a first conductivity type, the switching transistor $TR_2$ is formed from a transistor of a conductivity type opposite to the first conductivity type, the first conductive layer $L_1$ is connected to the second line via a fifth conductive layer $L_5$ which forms a rectifier junction with the first conductive layer $L_1$, and the semiconductor channel forming region $Ch_2$ is connected to a second fixed potential including zero potential.

To achieve the above object, in accordance with a second aspect of the invention, there is provided a semiconductor memory cell, as shown in the schematic diagram of FIG. 7, comprising:

an information storage transistor $TR_1$ comprising a first semiconductor channel layer $Ch_1$ having first and second opposing principal surfaces; first and second conductive gates, $G_1$ and $G_2$, respectively disposed opposite the two principal surfaces of the first semiconductor channel layer $Ch_1$ with first and second barrier layers respectively interposed therebetween; and first and second conductive regions, $L_1$ and $L_2$, each connected to either end of the first semiconductor channel layer $Ch_1$, and a switching transistor $TR_2$ comprising a second semiconductor channel layer $Ch_2$ having third and fourth opposing principal surfaces; third and fourth conductive gates, $G_3$ and $G_4$, respectively disposed opposite the two principal surfaces of the second semiconductor channel layer $Ch_2$ with third and fourth barrier layers respectively interposed therebetween; and third and fourth conductive layers, $L_3$ and $L_4$, each connected to either end of the second semiconductor channel region $Ch_2$, wherein the fourth conductive layer $L_4$ is connected to the second conductive gate $G_2$, the first conductive gate $G_1$ and the third conductive gate $G_3$ are connected to a first memory-cell-selection line, the first conductive layer $L_1$ and the third conductive layer $L_3$ are connected to a second memory-cell-selection line, the second conductive layer $L_2$ is connected to a fixed potential including zero potential, and the fourth conductive gate $G_4$ is connected to a read/write selection line.

In one preferred mode of the semiconductor memory cell according to the second aspect of the invention, as shown in the schematic diagram of FIG. 10, the information storage transistor $TR_1$ is formed from a transistor of a first conductivity type, the switching transistor $TR_2$ is formed from a transistor of a conductivity type opposite to the first conductivity type, the first conductive layer $L_1$ is connected to the second line via a fifth conductive layer $L_5$ which forms a rectifier junction with the first conductive layer $L_1$, and the fourth conductive gate $G_4$ is connected to a second fixed potential including zero potential.

To achieve the above object, in accordance with a third aspect of the invention, there is provided a semiconductor memory cell, as shown in the schematic diagram of FIG. 12(A), comprising:

an information storage transistor $TR_1$ of a first conductivity type, comprising a first semiconductor channel forming region $Ch_1$; a first conductive gate $G_1$ formed above the surface thereof with a first barrier layer interposed therebetween; a first conductive region $SC_1$; and a second conductive region $SC_2$, and a switching transistor $TR_2$ of a second conductivity type opposite to the first conductivity type, comprising a second semiconductor channel forming region $Ch_2$; a second conductive gate $G_2$ formed above the surface thereof with a second barrier layer interposed therebetween; a third conductive region $SC_3$; and a fourth conductive region $SC_4$, wherein the first conductive gate $G_1$ of the information storage transistor $TR_1$ and the second conductive gate $G_2$ of the switching transistor $TR_2$ are connected to a first memory-cell-selection line;

the fourth conductive region $SC_4$ of the switching transistor $TR_2$ is connected to the first semiconductor channel forming region $Ch_1$ of the information storage transistor $TR_1$;

the third conductive region $SC_3$ of the switching transistor $TR_2$ is connected to a second memory-cell-selection line, and the first conductive region $SC_1$ of the information storage transistor $TR_1$ is connected to a read line.

The second conductive region $SC_2$ of the information storage transistor $TR_1$ is supplied with a fixed potential including zero potential. Preferably, the first conductive region $SC_1$ is connected to the second line or the third conductive region $SC_3$ via a rectifier junction. Preferably, the first conductive region $SC_1$ is formed from a semiconductor as a common region with the second semiconductor channel forming region $Ch_2$, the rectifier junction being formed between the common region and the third conductive region $SC_3$, and the first semiconductor channel forming region $Ch_1$ and the fourth conductive region $SC_4$ are formed from a common region. Furthermore, the second conductive gate $G_2$ may be formed common with the first conductive gate $G_1$, as in a fifth aspect of the invention hereinafter described. In this case, it is desirable that the third conductive region $SC_3$ further include a metal layer of Mo, Al, or the like, or a silicide layer that forms a Schottky junction with the first conductive region $SC_1$.

In the above structure, the conductive regions may be formed from a low-resistivity semiconductor, a silicide, a two-layered structure of silicide and semiconductor, a metal, or the like.

To achieve the above object, in accordance with a fourth aspect of the invention, there is provided a semiconductor memory cell, as shown in the schematic diagram of FIG. 14(A), comprising:

an information storage transistor $TR_1$ of a first conductivity type, comprising a first semiconductor channel forming region $Ch_1$; a first conductive gate $G_1$ formed above the surface thereof with a first barrier layer interposed therebetween; a first conductive region $SC_1$; and a second conductive region $SC_2$, and a switching transistor $TR_2$ of a second conductivity type opposite to the first conductivity type, comprising a second semiconductor channel forming region $Ch_2$; a second conductive gate $G_2$ formed above the surface thereof with a second barrier layer interposed therebetween; a third conductive region $SC_3$; and a fourth conductive region $SC_4$, wherein the first conductive gate $G_1$ of the information storage transistor $TR_1$ and the second conductive gate $G_2$ of the switching transistor $TR_2$ are connected to a first memory-cell-selection line;

the fourth conductive region $SC_4$ of the switching transistor $TR_2$ is connected to the first semiconductor channel forming region $Ch_1$ of the information storage transistor $TR_1$;

the third conductive region $SC_3$ of the switching transistor $TR_2$ is connected to a second memory-cell-selection line, the second conductive region $SC_2$ of the information storage transistor $TR_1$ is connected to a fixed potential, and the first conductive region $SC_1$ of the information storage transistor $TR_1$ is connected to the third conductive region $SC_3$ of the switching transistor $TR_2$, forming a rectifier junction therebetween.

A third conductive gate $G_3$ may be further provided opposite a third principal surface of the second semiconductor channel forming region $Ch_2$ with a third barrier layer interposed therebetween.

To achieve the above object, in accordance with a fifth aspect of the invention, there is provided a semiconductor memory cell, as shown in the schematic diagram of FIG. 15(A), comprising:

a first semiconductor region $SC_1$ of a first conductivity type formed in a surface region of a semiconductor substrate or on an insulating substrate, a first conductive region $SC_2$ formed in a surface region of the first semiconductor region $SC_1$ in contacting relationship forming a rectifier junction therebetween, a second semiconductor region $SC_3$ of a second conductivity type formed in a surface region of the first semiconductor region $SC_1$ but spaced apart from the first conductive region $SC_2$, a second conductive region $SC_4$ formed in a surface region of the second semiconductor region $SC_3$ in contacting relationship forming a rectifier junction therebetween, and a conductive gate G disposed in such a manner as to form a bridge over a barrier layer between the first semiconductor region $SC_1$ and the second conductive region $SC_4$ and between the first conductive region $SC_2$ and the second semiconductor region $SC_3$, wherein the conductive gate G is connected to a first memory-cell-selection line, the first conductive region $SC_2$ is connected to a write information selection line, and the second conductive region $SC_4$ is connected to a second memory-cell-selection line.

To achieve the above object, in accordance with a sixth aspect of the invention, there is provided a semiconductor memory cell, as shown in the schematic diagram of FIG. 16(A), comprising:

a first semiconductor region $SC_1$ of a first conductivity type formed in a surface region of a semiconductor substrate or on an insulating substrate, a first conductive region $SC_2$ formed in a surface region of the first semiconductor region $SC_1$ in contacting relationship forming a rectifier junction therebetween, a second semiconductor region $SC_3$, of a second conductivity type opposite to the first conductivity type, formed in a surface region of the first semiconductor region $SC_1$ but spaced apart from the first conductive region $SC_2$, a second conductive region $SC_4$ formed in a surface region of the second semiconductor region $SC_3$ in contacting relationship forming a rectifier junction therebetween, and a conductive gate G disposed in such a manner as to form a bridge over a barrier layer between the first semiconductor region $SC_1$ and the second conductive region $SC_4$ and between the first conductive region $SC_2$ and the second semiconductor region $SC_3$, wherein the conductive gate G is connected to a first memory-cell-selection line, and the first semiconductor region $SC_1$ is connected to a second memory-cell-selection line.

In the semiconductor memory cell according to the fifth and sixth aspects of the invention, the first semiconductor region $SC_1$ (corresponding to the channel forming region $Ch_2$), the first conductive region $SC_2$ (corresponding to a source/drain region), the second semiconductor region $SC_3$ (corresponding to a source/drain region), and the conductive gate G constitute the switching transistor $TR_2$. Likewise, the second semiconductor region $SC_3$ (corresponding to the channel forming region $Ch_1$), the first semiconductor region $SC_1$ (corresponding to a source/drain region), the second conductive region $SC_4$ (corresponding to a source/drain region), and the conductive gate G constitute the information storage transistor $TR_1$.

The semiconductor channel layer or semiconductor channel forming region can be formed from a silicon, GaAs, or the like, using a known method. Each conductive gate can be formed from a metal, an impurity-added or doped silicon or polysilicon, a silicide, highly doped GaAs, or the like, using a known method. Each barrier layer can be formed from $SiO_2$, $Si_3N_4$, $Al_2O_3$, GaAlAs, or the like, using a known method. The conductive layers, conductive regions, or semiconductor regions can be formed from a doped silicon or polysilicon, a silicide, a highly doped GaAs, or the like, using a known method.

In the semiconductor memory cell of the present invention, one conductive gate of the information storage transistor and one conductive gate of the switching transistor are connected to the first memory-cell-selection line. The first memory-cell-selection line, therefore, need not be provided more than one, and the chip area can be reduced.

In the semiconductor memory cell of the first and second aspects of the present invention, the fourth conductive layer is connected to the second conductive gate. When writing information, the switching transistor conducts, and the information is stored in the form of a potential or charge on the second conductive gate of the information storage transistor. The threshold voltage of the information storage transistor required at the first conductive gate, when reading information, varies depending on the potential or charge (information) stored on the second conductive gate. This is because the space-charge regions overlap across the channel layer near the first and second gates. Therefore, when reading information, the operation of the information storage transistor can be controlled by applying an appropriately selected potential to the first conductive gate. Information reading is accomplished by sensing the operating condition (for example, magnitude of the channel current) of the information storage transistor.

In the information storage transistor, a conductive gate is provided opposite each of the two principal surfaces of the semiconductor channel layer. This structure stabilizes the operation of the information storage transistor and facilitates short-channel transistor design. This also eliminates the need for a large capacitor as required in prior art DRAMs.

The gate threshold voltage of the switching transistor is controlled by the potential applied to the read/write selection line. When writing information, the switching transistor is turned on in order to store the potential or charge on the second conductive gate, and when the write operation is completed, it is turned off. The stored information is retained as a potential or charge on the second conductive gate until the information is read out.

In the semiconductor memory cell according to the second aspect of the present invention, the switching transistor has the fourth conductive gate. This serves to further stabilize the operation of the switching transistor. This is achieved by applying to the read/write selection line a signal for putting the switching transistor in an off condition without fail during information read operation.

In the preferred modes of the semiconductor memory cell according to the first and second aspects of the present invention, the fifth conductive layer is provided which forms a rectifier junction with the first conductive layer. The provision of this fifth conductive layer serves to prevent without fail a current from flowing into the information storage transistor during the writing of information.

In the semiconductor memory cell according to the third and fourth aspects of the present invention, the fourth conductive region of the switching transistor is connected to the channel forming region of the information storage transistor. In the semiconductor memory cell according to the fifth aspect of the invention, the second semiconductor region, which forms a source/drain region of the switching transistor, corresponds to the channel forming region of the information storage transistor $TR_1$.

When writing information, the switching transistor conducts, and the information is stored as a potential or charge in the channel forming region of the information storage transistor. The threshold voltage of the information storage transistor required at the first conductive gate (in the third and fourth aspects of the invention) or the conductive gate (in the fifth aspect of the invention) for read operations varies depending on the potential or charge (information) stored in the channel forming region. Therefore, when reading information, by applying an appropriately selected potential to the first conductive gate or the conductive gate, the stored information state of the information storage transistor can be identified by the magnitude of the channel current (including zero current). Information reading is accomplished by sensing the operating condition of the information storage transistor.

In the semiconductor memory cell according to the sixth aspect of the present invention, the second semiconductor region $SC_3$, which forms a source/drain region of the switching transistor, corresponds to the channel forming region $Ch_1$ of the information storage transistor. Further, the first semiconductor region $SC_1$ that corresponds to the channel forming region of the switching transistor and also to a source/drain region of the information selection transistor is connected to the second memory-cell-selection line.

The threshold voltage of the information storage transistor required at each conductive gate for read operations can be varied by appropriately selecting the potential applied to the second memory-cell-selection line. Therefore, the on/off conditions of the information storage transistor and the switching transistor can be controlled by appropriately selecting the potential applied to the first memory-cell-selection line.

When writing information, the first line is set at a potential high enough to turn on the switching transistor, and the capacitor between the regions $SC_1$ and $SC_3$ of the switching transistor is charged depending on the potential on the second line. As a result, the information is stored in the channel forming region (the second semiconductor region $SC_3$) of the information storage transistor in the form of a charge or a potential difference from the region $SC_1$.

When reading information, the region $SC_1$ is supplied with a read potential, and the potential or charge (information) stored in the channel forming region of the information storage transistor is converted to a charge or a potential difference between the second semiconductor region $SC_3$, which corresponds to the channel forming region $Ch_1$, and the second conductive region $SC_4$, which corresponds to a source/drain region. The threshold voltage of the information storage transistor required at the conductive gate varies depending on the charge (information). Therefore, the on/off operations of the information storage transistor can be controlled, when reading information, by applying an appropriately selected potential to the conductive gate. Information reading is accomplished by sensing the operating condition of the information storage transistor.

In the semiconductor memory cell of the invention, the stored information is retained in the form of a potential, potential difference, or charge, but since the stored information decays with time because of leakage currents due to junction leaks, etc., refreshing is necessary, and the memory cell operates in the same manner as other DRAM cells.

DESCRIPTION OF THE PREFERRED EMBODIMENTS

The semiconductor memory cell of the invention will be described below in accordance with preferred embodiments thereof.

EMBODIMENT 1

Figure 1:
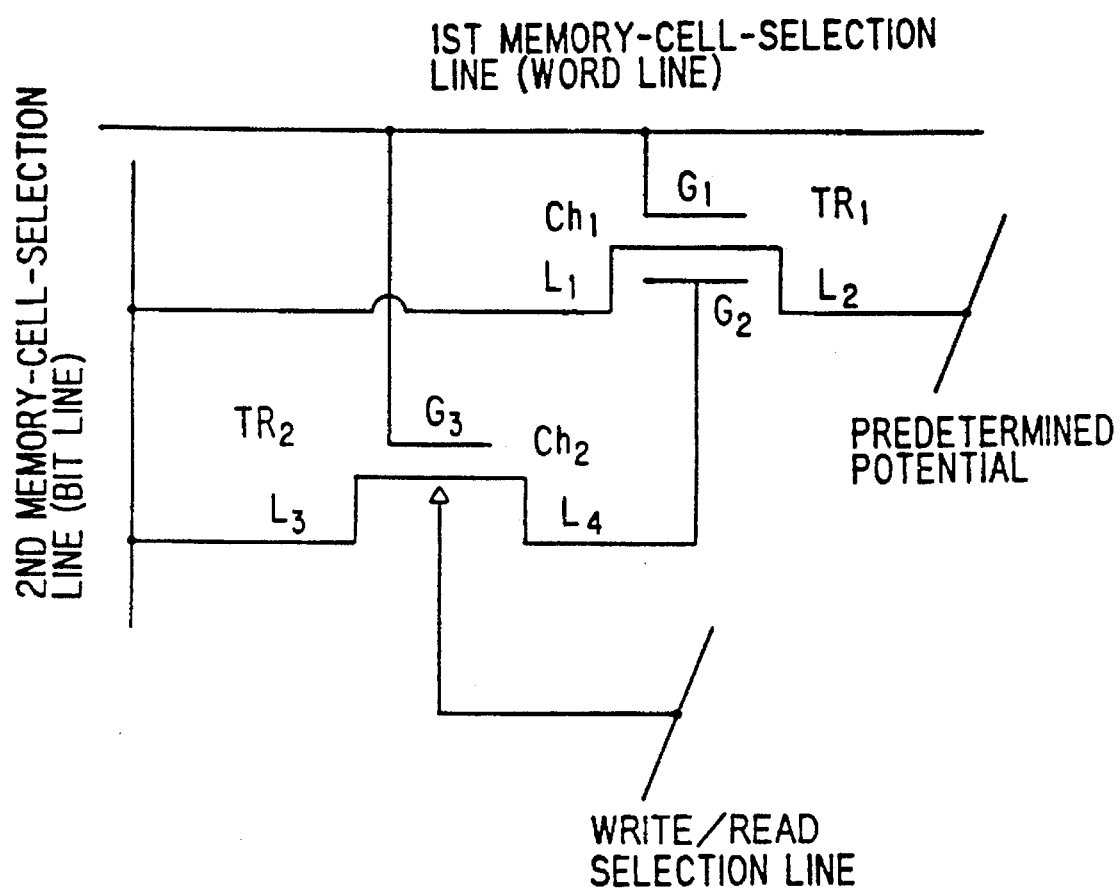
FIG. 1 is a diagram showing the principle of operation of a semiconductor memory cell according to a first aspect of the present invention.

Embodiment 1 is concerned with a semiconductor memory cell according to a first aspect of the invention. The semiconductor memory cell, the principle of operation of which is shown in FIG. 1 and cross sections of a portion of which are shown schematically in FIGS. 2 and 3, comprises an information storage transistor $TR_1$ and a switching transistor $TR_2$.

The information storage transistor $TR_1$ comprises a semiconductor channel layer $Ch_1$, a first conductive gate $G_1$, a second conductive gate $G_2$, and first and second conductive layers, $L_1$ and $L_2$, each connected to either end of the semiconductor channel layer $Ch_1$. The switching transistor $TR_2$ comprises a semiconductor channel forming region $Ch_2$, a third conductive gate $G_3$, and third and fourth conductive layers, $L_3$ and $L_4$, each formed in the surface area of the semiconductor channel forming region $Ch_2$ in contacting relationship forming a rectifier junction therewith. The third conductive gate $G_3$ is formed in such a manner as to bridge the third conductive layer $L_3$ and the fourth conductive layer $L_4$.

The semiconductor channel layer $Ch_1$ has two opposing principal surfaces, the first principal surface $MS_1$ and the second principal surface $MS_2$. The first conductive gate $G_1$ is formed opposite the principal surface $MS_1$ of the semiconductor channel layer with a first barrier layer $BL_1$ interposed therebetween. Likewise, the second conductive gate $G_2$ is formed opposite the principal surface $MS_2$ of the semiconductor channel layer with a second barrier layer $BL_2$ interposed therebetween. The semiconductor channel forming region $Ch_2$ has a third principal surface $MS_3$. The third conductive gate $G_3$ is formed opposite the third principal surface $MS_3$ of the semiconductor channel forming region $Ch_2$ with a third barrier layer $BL_3$ interposed therebetween.

The fourth conductive layer $L_4$ is connected to the second conductive gate $G_2$. The first conductive gate $G_1$ and the third conductive gate $G_3$ are connected to a first memory-cell-selection line (for example, a word line). In the structural example shown in FIG. 2, the first conductive gate $G_1$ and the third conductive gate $G_3$ are common. The first conductive layer $L_1$ and the third conductive layer $L_3$ are connected to a second memory-cell-selection line (for example, a bit line). The second conductive layer $L_2$ is connected to a fixed potential including zero potential. The semiconductor channel forming region $Ch_2$ is connected to a read/write selection line. The read/write selection line may be a common well or a substrate. In Embodiment 1, a common well is used. The second memory-cell-selection line (for example, a bit line) need not be provided more than one, and the chip area can be reduced.

The conductive layers may be formed from a low-resistivity semiconductor, a silicide, a two-layered structure of silicide and semiconductor, a metal or the like. The barrier layers serve as barriers to channel carriers, and may be formed from an insulating material or a wide-gap semiconductor material.

In Embodiment 1, the information storage transistor $TR_1$ has an SOI structure. That is, with the multilayered structure shown in FIG. 2, the total area that the information storage transistor and the switching transistor take up can be made approximately equal to the area that one transistor takes up, thus allowing the chip area to be reduced.

The operation of the semiconductor memory cell will be described below, taking for example a case in which the information storage transistor $TR_1$ and the switching transistor $TR_2$ are both n-type transistors.

3Potentials applied to the various lines for a memory write are designated as follows:

First memory-cell-selection line (e.g., word line): $V_W$

Second memory-cell-selection line (e.g., bit line)

"0" write: $V_0$

"1" write: $V_1$

Read/write selection line: $V_{B\_W}$

Potentials applied to the various lines for a memory read are designated as follows. Note that during a read cycle, the read/write selection line is reverse biased.

First memory-cell-selection line (e.g., word line): $V_R$

Read/write selection line: $V_{B\_R}$

For read/write, the fixed potential to which the second conductive layer $L_2$ is connected is designated as follows:

Fixed potential to which the second conductive layer $L_2$ is connected: $V_2$

The threshold voltages of the information storage transistor $TR_1$ required at the first conductive gate $G_1$ for memory read/write operations are designated as follows:

"0" read/write: $V_{TH1\_0}$

"1" read/write: $V_{TH1\_1}$

The potential of the second conductive gate $G_2$ is different between a "0" read/write and a "1" read/write. As a result, the threshold voltage of the information storage transistor $TR_1$ required at the first conductive gate $G_1$ differs between a "0" read/write and a "1" read/write. The information storage transistor $TR_1$ is provided with two conductive gates, $G_1$ and $G_2$, on opposite sides of the semiconductor channel layer $Ch_1$; this structure serves to stabilize the operation of the information storage transistor $TR_1$, and facilitates short-channel design. Furthermore, a capacitor having as large capacitance as required in prior art DRAMs is not required.

The threshold voltage of the switching transistor $TR_2$ required at the third conductive gate $G_3$ for a write operation is designated as $V_{TH2\_W}$. Further, the threshold voltage of the switching transistor $TR_2$ required at the third conductive gate $G_3$ for a read operation is designated as $V_{TH2\_R}$. The threshold voltage of the switching transistor $TR_2$ required at the third conductive gate $G_3$ is different between memory write and memory read because the potential applied to the read/write selection line differs between write and read operations.

The relationships between the various potentials are set as follows:

$$|V_W|>|V_{TH2\_W}|$$

$$|V_{TH1\_0}|>|V_R|>|V_{TH1\_1}|$$

$$|V_{TH2\_R}|>|V_R|$$

The operation of the semiconductor memory cell of Embodiment 1 will be described below.

Information write

When writing information "0" (second line potential: $V_0$) or "1" (second line potential: $V_1$), the potential of the first line is $V_W$. Therefore, the potential at the third conductive gate $G_3$ of the switching transistor $TR_2$ is also $V_W$. Since the potential of the read/write selection line is $V_{B\_W}$, the threshold voltage, $V_{TH2\_W}$, of the switching transistor $TR_2$ required at the third conductive gate has the following relationship with respect to $V_W$.

$$|V_W|>|V_{TH2\_W}|$$

As a result, the switching transistor $TR_2$ is ON. Therefore, the potential at the second conductive gate $G_2$ of the information transistor $TR_1$ is $V_0$ (when writing information "0") or $V_1$ (when writing information "1").

When writing information, the potential at the first conductive gate $G_1$ of the information storage transistor $TR_1$ is $V_W$. The threshold voltage of the information storage transistor $TR_1$ required at the first conductive gate $G_1$ is $V_{TH1\_0}$ or $V_{TH1\_1}$. If the relationship $$|V_W|>|V_{TH1\_0}|>|V_{TH1\_1}|$$

exists between these potentials, the information storage transistor $TR_1$ is also ON, but writing is performed whether the information storage transistor $TR_1$ is ON or OFF.

As described above, when writing information "0" or "1", the potential at the second conductive gate $G_2$ of the information storage transistor $TR_1$ is $V_0$ or $V_1$. That is, the second conductive gate $G_2$ is held at a potential corresponding to the information "0" or "1", and this condition is substantially maintained within a prescribed time until the information is read out. During the information retention period after the information is written and before the information is read out, the various portions of the information storage transistor $TR_1$ and the switching transistor $TR_2$ are set at such potentials that neither transistor will conduct.

Information read

When reading information "0" or "1", the potential of the first line is $V_R$. Therefore, the potential at the third conductive gate $G_3$ of the switching transistor $TR_2$ is $V_R$. Since the potential of the read/write selection line is $V_{B\_R}$, a reverse bias is applied between the source and the channel forming region of the switching transistor $TR_2$. $V_{B\_R}$ is set so that the threshold voltage $V_{TH2\_R}$, of the switching transistor $TR_2$ required at the third conductive gate has the following relationship with respect to $V_R$.

$$|V_{TH2\_R}|>|V_R|$$

The switching transistor $TR_2$ is thus held OFF.

When reading information, the potential at the first conductive gate $G_1$ of the information storage transistor $TR_1$ is $V_R$. The threshold voltage of the information storage transistor $TR_1$ at the first conductive gate $G_1$ is $V_{TH1\_0}$ or $V_{TH1\_1}$. The threshold voltage of the information storage transistor $TR_1$ is dependent on the potential of the second conductive gate $G_2$. The following relationship exists between these potentials.

$$|V_{TH1\_0}|>|V_R|>|V_{TH1\_1}|$$

Therefore, when the stored information is "0", the information storage transistor $TR_1$ is OFF. On the other hand, when the stored information is "1", the information storage transistor $TR_1$ is ON.

Thus, the information storage transistor $TR_1$ is set to an ON or OFF condition, depending on the stored information. Therefore, when the stored information is "1", current flows to the second line; when the stored information is "0", no current but the leakage current flows to the second line. The stored information can be read in this manner by the information storage transistor $TR_1$.

The above-described operating conditions of the information storage transistor $TR_1$ and the switching transistor $TR_2$ are summarized in Table 1. The potential values given in Table 1 are only illustrative examples, and each potential can take any value as long as it satisfies the above conditions.

TABLE 1

Unit: volts

| Memory write | "0" write | | "1" write | |
|---|---|---|---|---|
| 1st line potential | $V_W$ | 2.0 | $V_W$ | 2.0 |
| 2nd line potential | $V_0$ | 0 | $V_1$ | 1.0 |
| Read/write line | $V_{B-W}$ | | $V_{B-W}$ | |
| Threshold of $TR_2$ required at 3rd gate | $V_{TH2-W}$ | 0.5 | $V_{TH2-W}$ | 0.5 |
| 3rd gate potential | $V_W$ | 2.0 | $V_W$ | 2.0 |
| Condition of $TR_2$ | ON | | ON | |
| 2nd gate potential | $V_0$ | 0 | $V_1$ | 1.0 |
| Threshold of $TR_1$ required at 1st gate | $V_{TH1-0}$ | 1.1 | $V_{TH1-1}$ | 0.5 |
| 1st gate potential | $V_W$ | 2.0 | $V_W$ | 2.0 |
| condition of $TR_1$ | ON | | ON | |

| Memory read | "0" read | | "1" read | |
|---|---|---|---|---|
| 1st line potential | $V_R$ | 1.0 | $V_R$ | 1.0 |
| Read/write line | $V_{B-R}$ | | $V_{B-R}$ | |
| Threshold of $TR_2$ required at 3rd gate | $V_{TH2-R}$ | 1.5 | $V_{TH2-R}$ | 1.5 |
| 3rd gate potential | $V_R$ | 1.0 | $V_R$ | 1.0 |
| Condition of $TR_2$ | OFF | | OFF | |
| 2nd gate potential | $V_0$ | 0 | $V_1$ | 1.0 |
| Threshold of $TR_1$ required at 1st gate | $V_{TH1-0}$ | 1.1 | $V_{TH1-1}$ | 0.5 |
| 1st gate potential | | 1.0 | | 1.0 |
| Condition of $TR_2$ | OFF | | ON | |
| Fixed potential | $V_2$ | 0 | $V_2$ | 0 |
| 2nd line current | OFF | | ON | |

Figure 2:
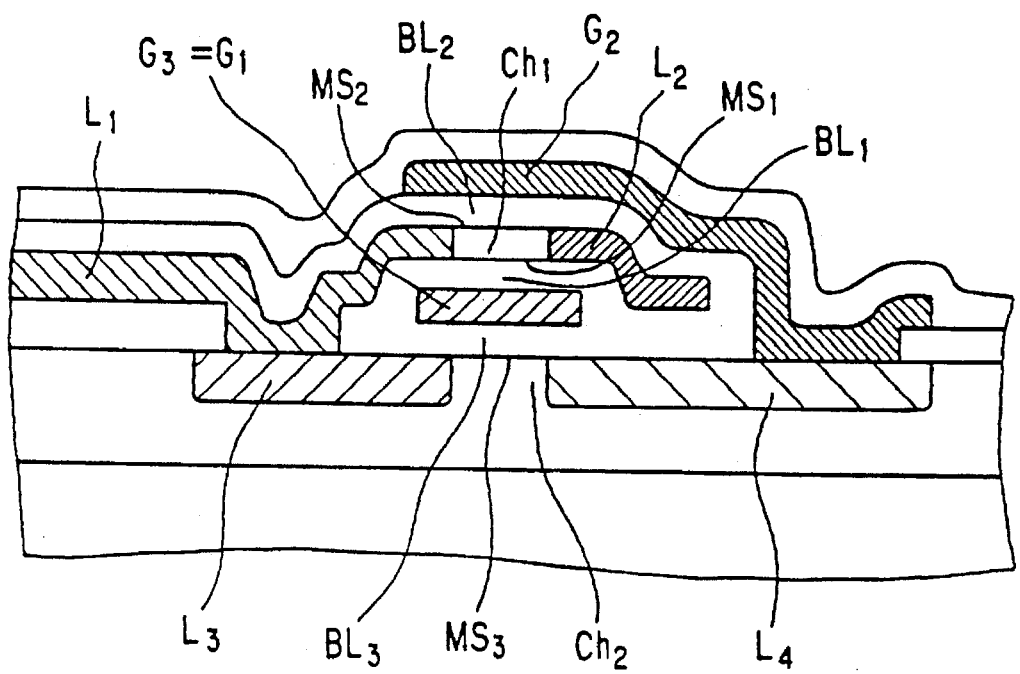
FIG. 2 is a schematic cross-sectional view of a portion of a semiconductor memory cell according to Embodiment 1 of the present invention.
Figure 3:
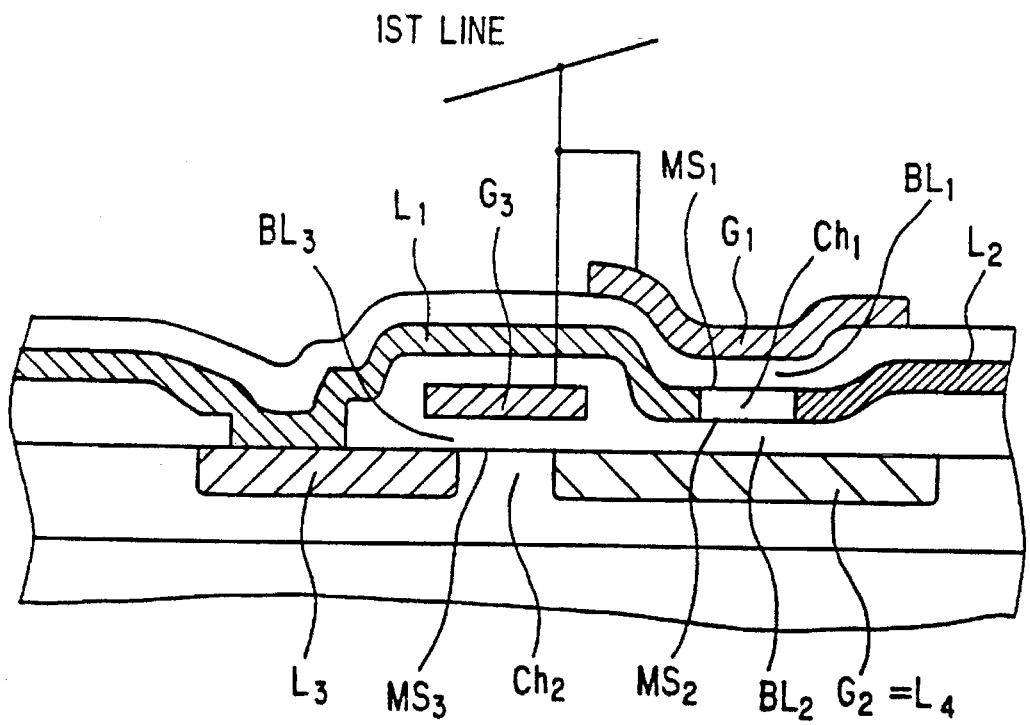
FIG. 3 is a diagram showing a modified example of Embodiment 1.

A modified example of the semiconductor memory cell of Embodiment 1 illustrated in FIG. 2 is shown schematically in cross section in FIG. 3. In the semiconductor memory cell shown in FIG. 2, the first conductive gate $G_1$ and the third conductive gate $G_3$ are common. By contrast, in the semiconductor memory cell shown in FIG. 3, the second conductive gate $G_2$ and the fourth conductive layer $L_4$ are common. Also, the read/write selection line is formed from a well. While a slightly larger plan area is required as compared with the memory cell shown in FIG. 2, the memory cell shown in FIG. 3 have the advantages of relatively smooth surface topography, which is advantageous in lithography, and a less number of contacts.

EMBODIMENT 2

Figure 4:
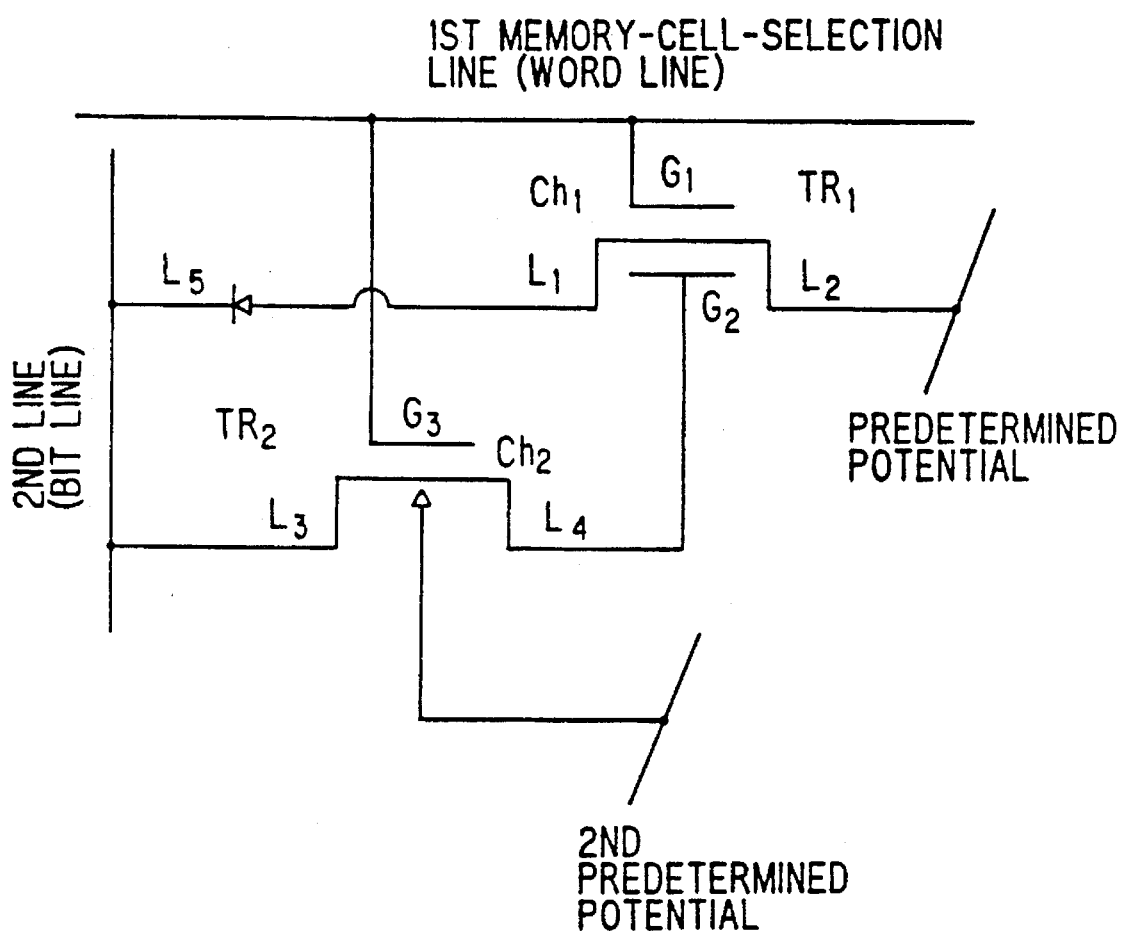
FIG. 4 is a diagram showing the principle of operation of a semiconductor memory cell according to a preferred mode of the first aspect of the invention.

Embodiment 2 is concerned with a preferred mode of the semiconductor memory according to the first aspect of the invention. The semiconductor memory cell, the principle of operation of which is shown in FIG. 4 and cross sections of a portion of which are shown schematically in FIGS. 5 and 6, comprises an information storage transistor $TR_1$ and a switching transistor $TR_2$. The structures of the information storage transistor $TR_1$ and the switching transistor $TR_2$ are fundamentally the same as those of Embodiment 1, except for the points hereinafter described.

The information transistor $TR_1$ is formed from a transistor of a first conductivity type, for example, a p-type transistor, and the switching transistor $TR_2$ is formed from a transistor of the opposite conductivity type to that of the information storage transistor $TR_1$, for example, an n-type transistor. In this case, if the first conductive layer $L_1$ and the second conductive layer $L_2$ are formed from semiconductor material, then their conductivity type should be p type. Likewise, if the first conductive gate $G_1$, the second conductive gate $G_2$, the third conductive gate $G_3$, the third conductive layer $L_3$, and the fourth conductive layer $L_4$ are formed from semiconductor material, then their conductivity type should be $n^+$ type. Alternatively, these regions may be formed from a silicide, a two-layer structure of silicide and semiconductor, or a metal. The semiconductor channel forming region $Ch_2$ is connected to a second fixed potential including zero potential.

Further, the first conductive layer $L_1$ is connected to the second line via a fifth conductive layer $L_5$ which forms a rectifier junction with the first conductive layer. The provision of the fifth conductive layer serves to prevent without fail a current from flowing into the information storage transistor $TR_1$ during the writing of information. Furthermore, there is no possibility of the information write voltage being applied to the information storage transistor $TR_1$ and thereby interfering with the write operation as was the case with the prior art.

The operation of the semiconductor memory cell of Embodiment 2 will be described below.

The potentials of the information storage transistor $TR_1$ and the switching transistor $TR_2$ are set to satisfy the following relationships.

$$|V_W|>|V_{TH2\_W}|$$

$$|V_{TH1\_1}|>|V_R|>|V_{TH1\_0}|$$

Information write

When writing information "0" (second line potential: $V_0$) or "1" (second line potential: $V_1$), the potential of the first line is $V_W$ (>0). Therefore, the potential at the third conductive gate $G_3$ of the switching transistor $TR_2$ is also $V_W$ (>0). Since the second fixed potential is $V_{B\_W}$, if $V_W$ is set as $$|V_W|>|V_{TH2\_W}+V_0 \text{ or } V_1|$$

where $V_{TH2\_W}$ is the threshold voltage of the switching transistor $TR_2$ required at the third conductive gate $G_3$, then the switching transistor $TR_2$ is ON. Therefore, the potential at the second conductive gate $G_2$ of the information transistor $TR_1$ is $V_0$ (when writing information "0") or $V_1$ (when writing information "1").

When writing information, the potential at the first conductive gate $G_1$ of the information storage transistor $TR_1$ is $V_W$ (>0). Therefore, when $V_0$ or $V_1 < V_W - V_{TH1\_1}$, the information storage transistor $TR_1$ is OFF. Even if it is ON, current flow is blocked by the presence of the rectifier junction between the first conductive layer $L_1$ and the fifth conductive layer $L_5$.

As described above, when writing information "0" or "1", the potential at the second conductive gate $G_2$ of the information storage transistor $TR_1$ is $V_0$ or $V_1$. That is, the second conductive gate $G_2$ is held at a potential corresponding to the information "0" or "1", and this condition is substantially maintained until the information is read out. During the information retention period after the information is written and before the information is read out, the various portions of the information storage transistor $TR_1$ and the switching transistor $TR_2$ are set at such potentials that neither transistor will conduct.

Information read

When reading information "0" or "1", the potential of the first line is $V_R$ (<0). Therefore, the potential at the third conductive gate $G_3$ of the switching transistor $TR_2$ is $V_R$ (<0), and the switching transistor $TR_2$ remains OFF unless the potential of the second line is made more negative than $V_R$–$V_{TH2\_R}$. Normally, for a read operation, the second line is set at a small potential and information is read by sensing the current.

The potential at the first conductive gate $G_1$ of the information storage transistor $TR_1$ is $V_R$ (<0). The threshold voltage of the information storage transistor $TR_1$ required at the first conductive gate $G_1$ is $V_{TH1\_0}$ or $V_{TH1\_1}$. The threshold voltage of the information storage transistor $TR_1$ is dependent on the potential of the second conductive gate $G_2$. The following relationship exists between these potentials.

$$|V_{TH1\_1}|>|V_R|>|V_{TH1\_0}|$$

Therefore, when the stored information is "0", the information storage transistor $TR_1$ is ON. On the other hand, when the stored information is "1", the information storage transistor $TR_1$ is OFF.

Thus, the information storage transistor $TR_1$ is set to an ON or OFF condition, depending on the stored information. The second conductive layer $L_2$ of the information storage transistor $TR_1$ is connected to the fixed potential ($V_2$); therefore, when the stored information is "0", current flows to the second line, and when the stored information is "1", current does not flow to the second line. The stored information can be read in this manner by the information storage transistor $TR_1$.

Figure 5:
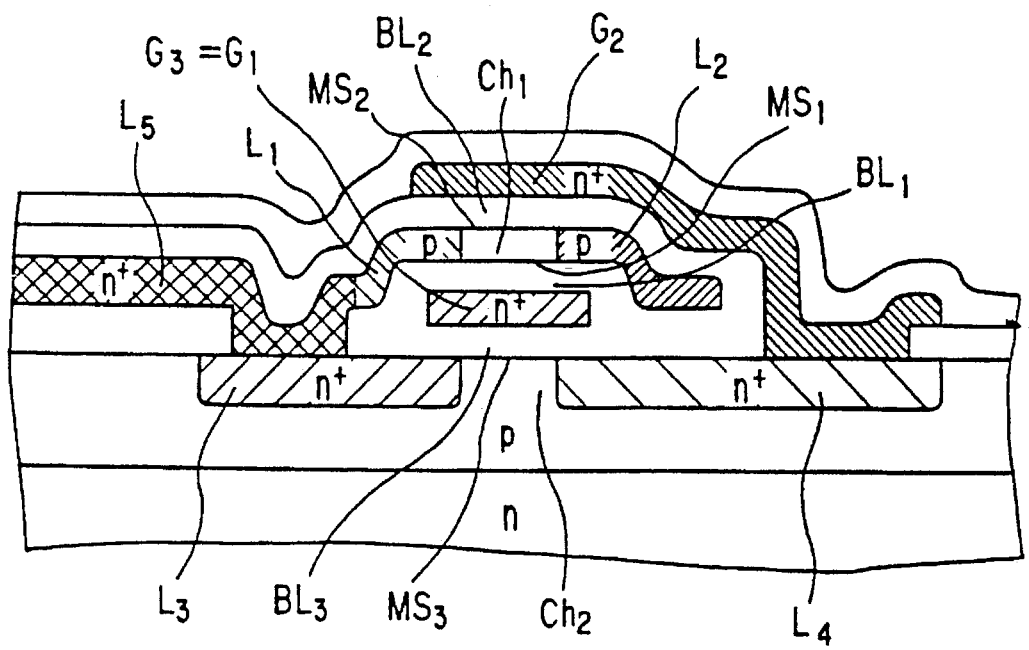
FIG. 5 is a schematic cross-sectional view of a portion of a semiconductor memory cell according to Embodiment 2 of the present invention.

A cross section of a portion of the semiconductor memory cell of Embodiment 2 is shown schematically in FIG. 5. The semiconductor memory cell of Embodiment 2 is fundamentally the same as the semiconductor memory cell shown in FIG. 2, except that the information storage transistor $TR_1$ and the switching transistor $TR_2$ are of different conductivity types and that the first conductive layer $L_1$ is connected to the second line via the n-type fifth conductive layer $L_5$ which forms a rectifier junction with the p-type first conductive layer $L_1$.

Table 2 summarizes the operating conditions of the semiconductor memory cell in which the information storage transistor $TR_1$ is formed from a p-type transistor and the switching transistor $TR_2$ is formed from an n-type transistor.

TABLE 2

Unit: volts

| Memory write | "0" write | | "1" write | |
| --- | --- | --- | --- | --- |
| 1st line potential | $V_W$ | 1.5 | $V_W$ | 1.5 |
| 2nd line potential | $V_0$ | 0 | $V_1$ | 1.0 |
| Read/write line | | $V_{B-W}$ | | $V_{B-W}$ |
| Threshold of $TR_2$ required at 3rd gate | $V_{TH2-W}$ | 0.5 | $V_{TH2-W}$ | 0.5 |
| 3rd gate potential | $V_W$ | 1.5 | $V_W$ | 1.5 |
| Condition of $TR_2$ | | ON | | ON |
| 2nd gate potential | $V_0$ | 0 | $V_1$ | 1.0 |
| 1st gate potential | $V_W$ | 1.5 | $V_W$ | 1.5 |
| Condition of $TR_1$ | | OFF | | OFF |

| Memory read | "0" read | | "1" read | |
| --- | --- | --- | --- | --- |
| 1st line potential | $V_R$ | −1.0 | $V_R$ | −1.0 |
| 3rd gate potential | $V_R$ | −1.0 | $V_R$ | −1.0 |
| Condition of $TR_2$ | | OFF | | OFF |
| 2nd gate potential | $V_0$ | 0 | $V_1$ | 1.0 |
| Threshold of $TR_1$ required at 1st gate | $V_{TH1-0}$ | −0.5 | $V_{TH1-1}$ | −1.1 |
| 1st gate potential | | −1.0 | | −1.0 |
| Condition of $TR_1$ | | ON | | OFF |
| Fixed potential | | $V_2$ | | $V_2$ |
| 2nd gate current | | ON | | OFF |

The potential values given in Table 2 are only illustrative examples, and each potential can take any value as long as it satisfies the above conditions.

Figure 6:
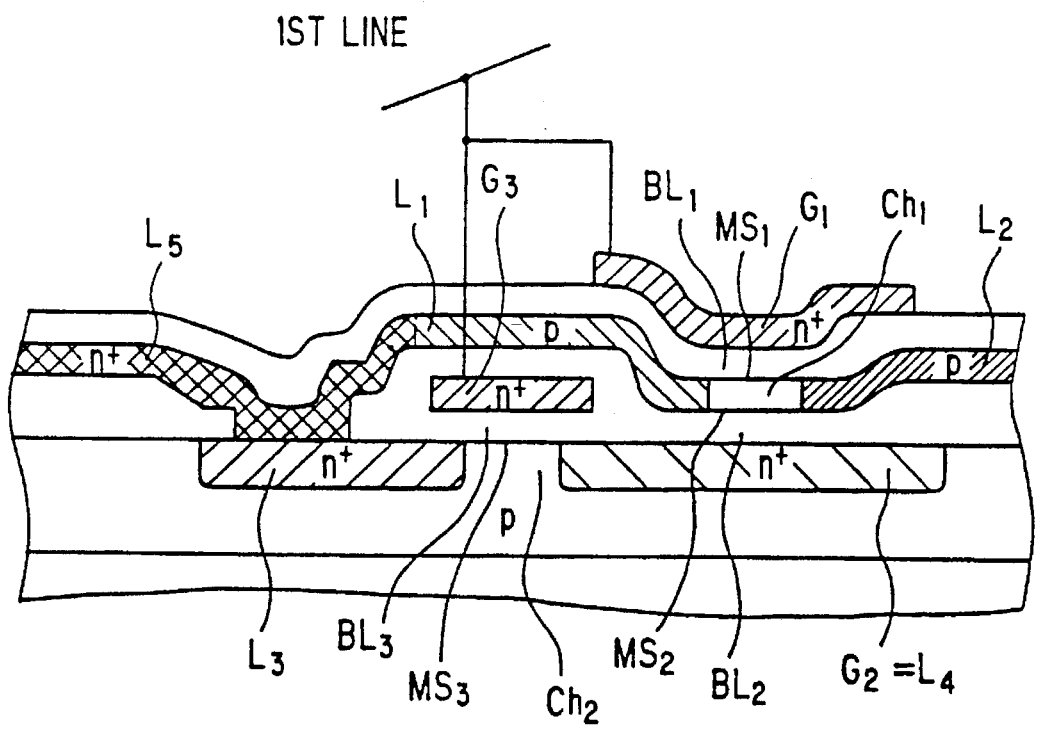
FIG. 6 is a diagram showing a modified example of Embodiment 2.

A modified example of the semiconductor memory cell illustrated in FIG. 5 is shown schematically in cross section in FIG. 6. The semiconductor memory cell shown is fundamentally the same as the semiconductor memory cell shown in FIG. 3, except that the information storage transistor $TR_1$ and the switching transistor $TR_2$ are of different conductivity types and that the first conductive layer $L_1$ is connected to the second line via the n-type fifth conductive layer $L_5$ which forms a rectifier junction with the p-type first conductive layer $L_1$.

Embodiment 3

Figure 7:
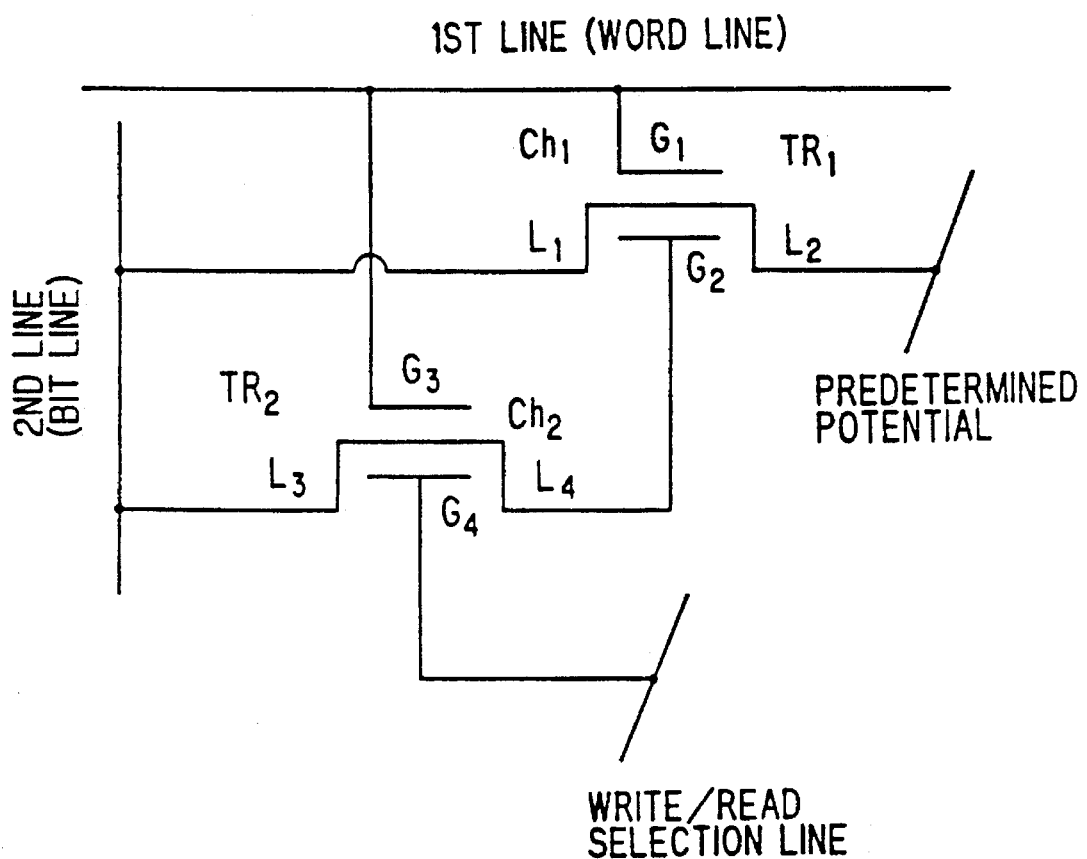
FIG. 7 is a diagram showing the principle of operation of a semiconductor memory cell according to a second aspect of the present invention.

Embodiment 3 is concerned with a semiconductor memory cell according to a second aspect of the invention. The semiconductor memory cell, the principle of operation of which is shown in FIG. 7 and cross sections of a portion of which are shown schematically in FIGS. 8 and 9, comprises an information storage transistor $TR_1$ and a switching transistor $TR_2$. The information storage transistor $TR_1$ comprises a first semiconductor channel layer $Ch_1$, a first conductive gate $G_1$, a second conductive gate $G_2$, and first and second conductive layers, $L_1$ and $L_2$, each connected to either end of the first semiconductor channel layer $Ch_1$. The switching transistor $TR_2$ comprises a second semiconductor channel layer $Ch_2$, a third conductive gate $G_3$, a fourth conductive gate $G_4$, and third and fourth conductive layers, $L_3$ and $L_4$, each connected to either end of the second semiconductor channel layer $Ch_2$. In Embodiment 3, the information storage transistor $TR_1$ and the switching transistor $TR_2$ both have an SOI structure (including a structure in which the barrier layer is formed from a wide-gap semiconductor, for example, GaAlAs as compared with GaAs).

The first semiconductor channel layer $Ch_1$ has two opposing principal surfaces, the first principal surface $MS_1$ and the second principal surface $MS_2$. The first conductive gate $G_1$ is formed opposite the principal surface $MS_1$ of the first semiconductor channel layer with a first barrier layer $BL_1$ interposed therebetween. Likewise, the second conductive gate $G_2$ is formed opposite the principal surface $MS_2$ of the first semiconductor channel layer with a second barrier layer $BL_2$ interposed therebetween.

The second semiconductor channel layer $Ch_2$ has two opposing principal surfaces, the third principal surface $MS_3$ and the fourth principal surface $MS_4$. The third conductive gate $G_3$ is formed opposite the third principal surface $MS_3$ of the second semiconductor channel layer $Ch_2$ with a third barrier layer $BL_3$ interposed therebetween. Likewise, the fourth conductive gate $G_4$ is formed opposite the fourth principal surface $MS_4$ of the second semiconductor channel layer $Ch_2$ with a third barrier layer $BL_4$ interposed therebetween.

The fourth conductive layer $L_4$ is connected to the second conductive gate $G_2$. In Embodiment 3, the fourth conductive layer $L_4$ and the second conductive gate $G_2$ are common. The first conductive gate $G_1$ and the third conductive gate $G_3$ are connected to a first memory-cell-selection line (for example, a word line). The first conductive layer $L_1$ and the third conductive layer $L_3$ are connected to a second memory-cell-selection line (for example, a bit line). The second conductive layer $L_2$ is connected to a fixed potential including zero potential. The fourth conductive gate $G_4$ is connected to a read/write selection line.

The semiconductor memory cell of Embodiment 3 is different from the semiconductor memory cell of Embodiment 1 in that the switching transistor $TR_2$ has the fourth conductive gate $G_4$. This serves to further stabilize the operation of the switching transistor $TR_2$ and yet allows further miniaturization.

When the information storage transistor $TR_1$ and the switching transistor $TR_2$ are both n-type transistors, the operation of the semiconductor memory cell is the same as that described in Embodiment 1 (see Table 1), and therefore, detailed explanation thereof is not repeated here.

Figure 8:
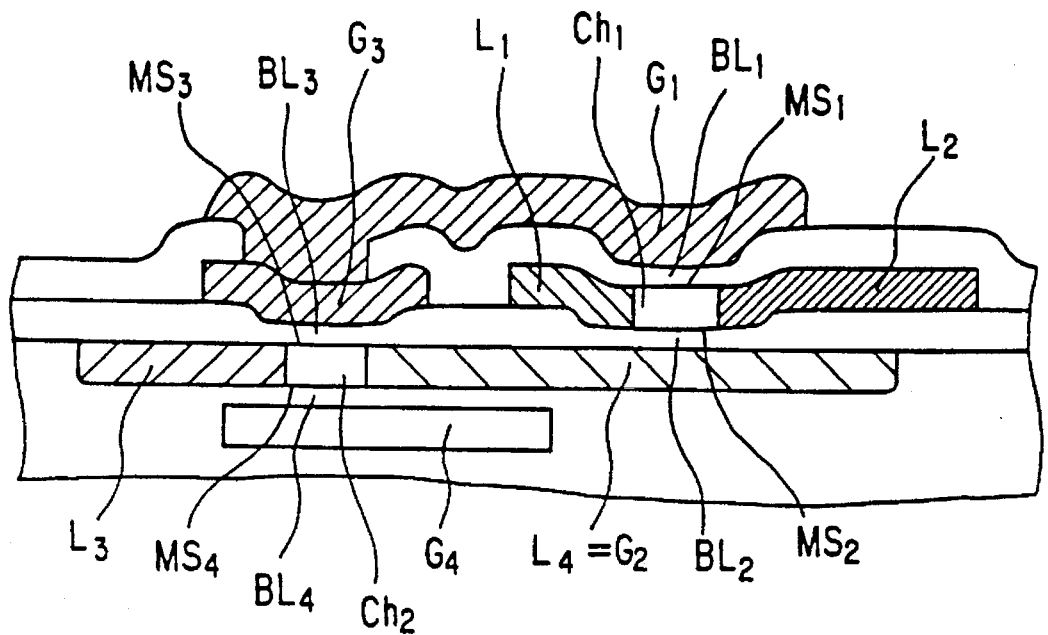
FIG. 8 is a schematic cross-sectional view of a portion of a semiconductor memory cell according to Embodiment 3 of the present invention.
Figure 9:
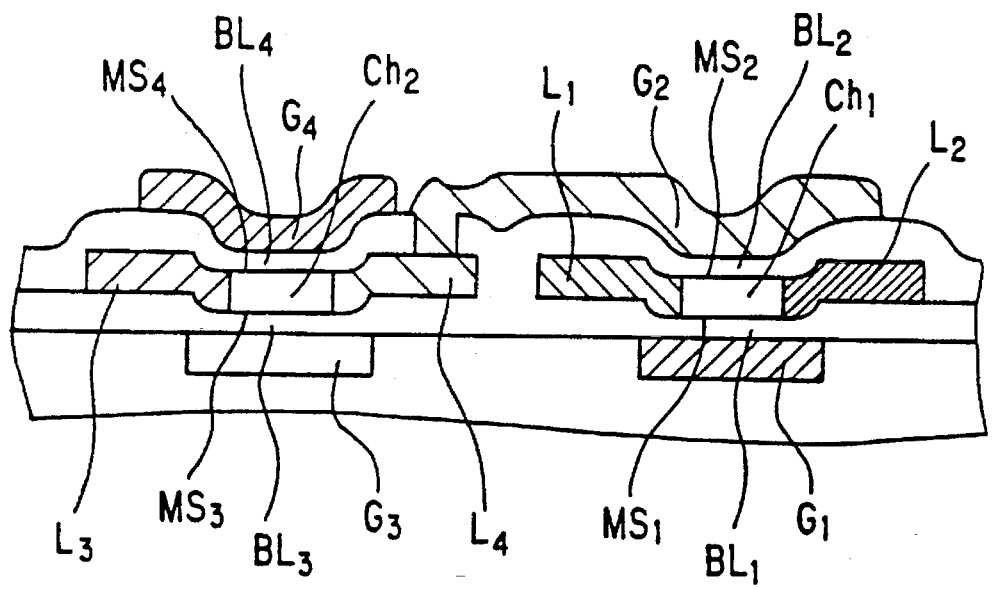
FIG. 9 is a diagram showing a modified example of Embodiment 3.

A modified example of the semiconductor memory cell of Embodiment 3 illustrated in FIG. 8 is shown schematically in cross section in FIG. 9. In the semiconductor memory cell shown in FIG. 8, the second conductive gate $G_2$ and the fourth conductive layer $L_4$ are common. By contrast, in the semiconductor memory cell shown in FIG. 9, the first conductive gate $G_1$ and the third conductive gate $G_3$ are formed in the same substrate surface. The first conductive gate $G_1$ and the third conductive gate $G_3$ may be connected to each other. While a slightly larger plan area is required than that of the memory cell shown in FIG. 8, the memory cell shown in FIG. 9 has the advantage that the first semiconductor channel layer $Ch_1$ and the second semiconductor channel layer $Ch_2$ can be formed using a single high-quality semiconductor layer whereas two such layers are needed in the structure of the semiconductor memory cell shown in FIG. 8. There is a further advantage that the first conductive gate $G_1$ and the third conductive gate $G_3$ can be made common.

Embodiment 4

Figure 10:
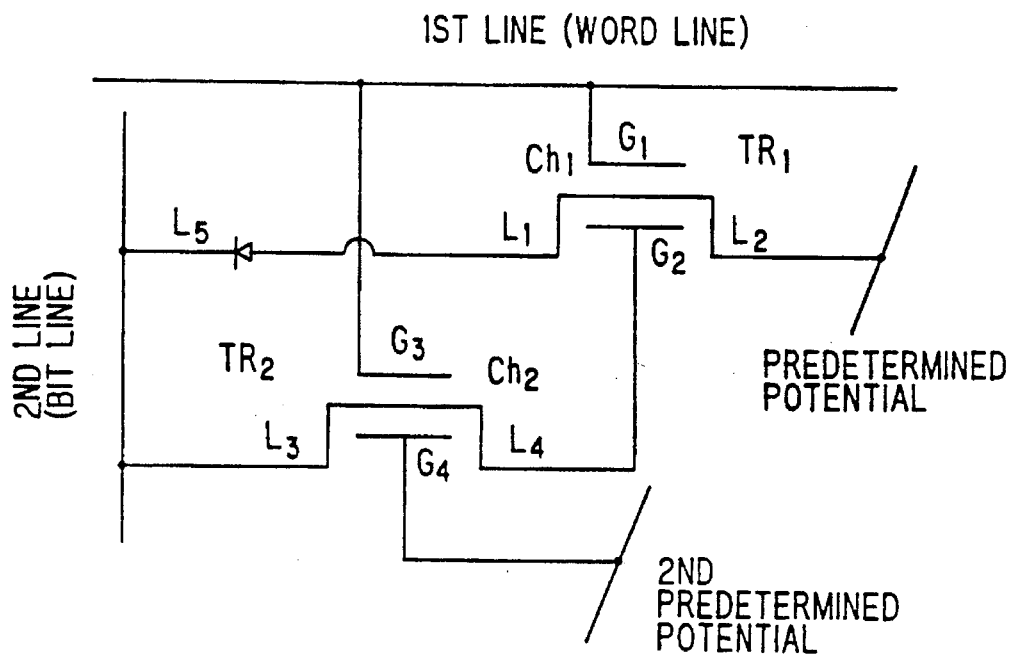
FIG. 10 is a diagram showing the principle of operation of a semiconductor memory cell according to a preferred mode of the second aspect of the present invention.

Embodiment 4 is concerned with a preferred mode of the semiconductor memory cell according to the second aspect of the invention. The semiconductor memory cell, the principle of operation of which is shown in FIG. 10 and a cross section of a portion of which is shown schematically in FIG. 11, comprises an information storage transistor $TR_1$ and a switching transistor $TR_2$. The structures of the information storage transistor $TR_1$ and the switching transistor $TR_2$ are fundamentally the same as those of Embodiment 3, except for the points hereinafter described.

The information transistor $TR_1$ is formed from a transistor of a first conductivity type, for example, a p-type transistor, and the switching transistor $TR_2$ is formed from a transistor of the opposite conductivity type to that of the information storage transistor $TR_1$, for example, an n-type transistor. In this case, if the first conductive layer $L_1$ and the second conductive layer $L_2$ are formed from semiconductor material, then their conductivity type should be p type. Likewise, if the first conductive gate $G_1$, the second conductive gate $G_2$, the third conductive gate $G_3$, the fourth conductive gate $G_4$, the third conductive layer $L_3$, and the fourth conductive layer $L_4$ are formed from semiconductor material, then their conductivity type should be $n^+$ type. The fourth conductive gate $G_4$ is connected to a second fixed potential including zero potential.

Further, the first conductive layer $L_1$ is connected to the second line via an n-type fifth conductive layer $L_5$ which forms a rectifier junction with the p-type first conductive layer $L_1$.

Figure 11:
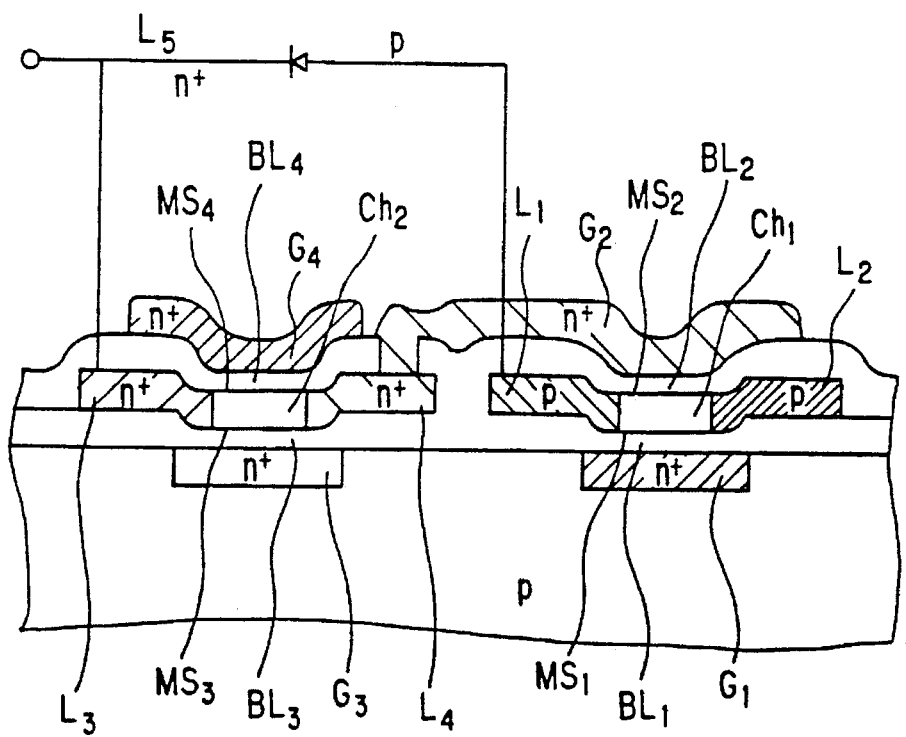
FIG. 11 is a schematic cross-sectional view of a portion of a semiconductor memory cell according to Embodiment 4 of the present invention.

A cross section of a portion of the semiconductor memory cell of Embodiment 4 is shown schematically in FIG. 11. The semiconductor memory cell of Embodiment 3 is fundamentally the same as the semiconductor memory cell shown in FIG. 9, except that the first and second conductive layers, $L_1$ and $L_2$, are of different conductivity type and that the first conductive layer $L_1$ is connected to the second line via the $n^+$ fifth conductive layer $L_5$ which forms a rectifier junction with the p-type first conductive layer $L_1$. In FIG. 11, the fifth conductive layer $L_5$ and the rectifier junction between the first conductive layer $L_1$ and the fifth conductive layer $L_5$ are shown in schematic form for simplicity. It will also be appreciated that the first conductive gate $G_1$ and the third conductive gate $G_3$ may be connected to each other.

When the information storage transistor $TR_1$ is formed from a p-type transistor and the switching transistor $TR_2$ from an n-type transistor, the operation of the semiconductor memory cell is the same as that described in Embodiment 2 (see Table 2), and therefore, detailed explanation thereof is not repeated here.

Embodiment 5

Figure 12A:
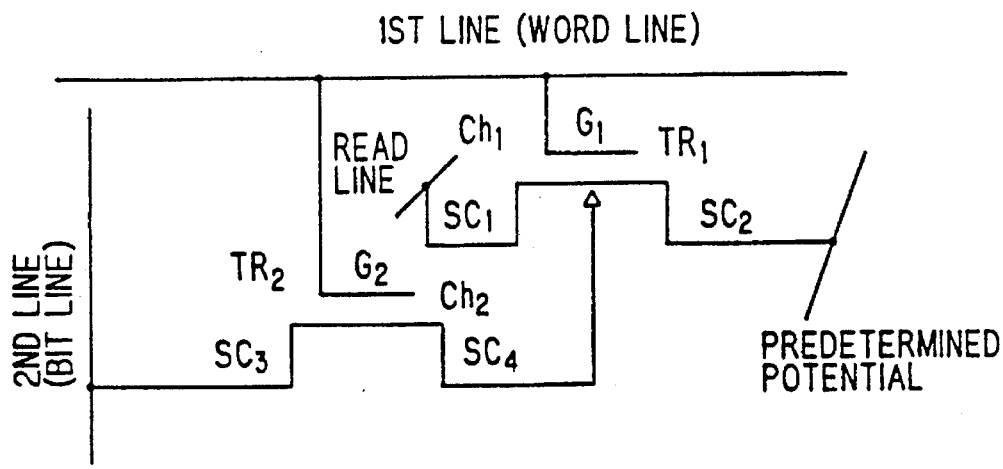
FIGS. 12A to 12C shows the principle of operation of a semiconductor memory cell according to a third aspect of the present invention along with schematic cross-sectional views showing a portion thereof.

Embodiment 5 is concerned with a semiconductor memory cell according to a third aspect of the invention. The semiconductor memory cell, the principle of operation of which is shown in FIG. 12(A) and a cross section of a portion of which is shown schematically in FIG. 12(B), comprises an information storage transistor $TR_1$ formed from a field-effect transistor of a first conductivity type (for example, n type) and a switching transistor $TR_2$ formed from a field-effect transistor of a second conductivity type (for example, p type).

The information storage transistor $TR_1$ comprises a first channel forming region $Ch_1$ of the second conductivity type, a first conductive gate $G_1$ formed above the first semiconductor channel forming region $Ch_1$ with a first barrier layer interposed therebetween, and first and second conductive regions, $SC_1$ and $SC_2$, separated by the first conductive gate $G_1$. The first conductive gate $G_1$ is formed in such a manner as to bridge the first conductive region $SC_1$ and the second conductive region $SC_2$.

The switching transistor $TR_2$ comprises a second semiconductor channel forming region $Ch_2$ of the first conductivity type, a second conductive gate $G_2$ formed above the second semiconductor channel forming region $Ch_2$ with a second barrier layer interposed therebetween, a third conductive region $SC_3$, and a fourth conductive region $SC_4$. The second conductive gate $G_2$ is formed in such a manner as to bridge the third conductive region $SC_3$ and the fourth conductive region $SC_4$.

More specifically, the conductive regions are the source and drain regions. The first and second conductive regions, $SC_1$ and $SC_2$, are each formed from a low-resistivity semiconductor of the opposite conductivity type to that of the first semiconductor channel forming region $Ch_1$, or from a metal or a silicide that forms a rectifier junction with the first semiconductor channel forming region $Ch_1$. Likewise, the third and fourth conductive regions, $SC_3$ and $SC_4$, are each formed from a low-resistivity semiconductor of the opposite conductivity type to that of the second semiconductor channel forming region $Ch_2$, or from a metal or a silicide that forms a rectifier junction with the second semiconductor channel forming region $Ch_2$.

The first conductive gate $G_1$ of the storage transistor $TR_1$ and the second conductive gate $G_2$ of the switching transistor $TR_2$ are connected to a first memory-cell-selection line (for example, a word line). The fourth conductive region $SC_4$ of the switching transistor $TR_2$ is connected to, or formed common with, the channel forming region $Ch_1$ of the storage transistor $TR_1$. The third conductive region $SC_3$ of the switching transistor $TR_2$ is connected to a second memory-cell-selection line (for example, a bit line). The first conductive region $SC_1$ of the information storage transistor $TR_1$ is connected to a read line. The second conductive region $SC_2$ is connected to a fixed potential including zero potential.

Potentials applied to the various lines for a memory write are designated as follows:

First memory-cell-selection line (e.g., word line): $V_W$

Second memory-cell-selection line (e.g., bit line)

"0" write: $V_0$

"1" write: $V_1$

Read potential is designated as follows:

First memory-cell-selection line (e.g., word line): $V_R$

Also, for a memory read, the potential of the read line to which the first conductive region $SC_1$ of the information storage transistor $TR_1$ is connected is designated as follows:

Read line potential: $V_2$

The threshold voltages of the information storage transistor $TR_1$ required at the first conductive gate $G_1$ for read operations are designated as follows:

"0" read: $V_{TH1\_0}$

Figure 17:
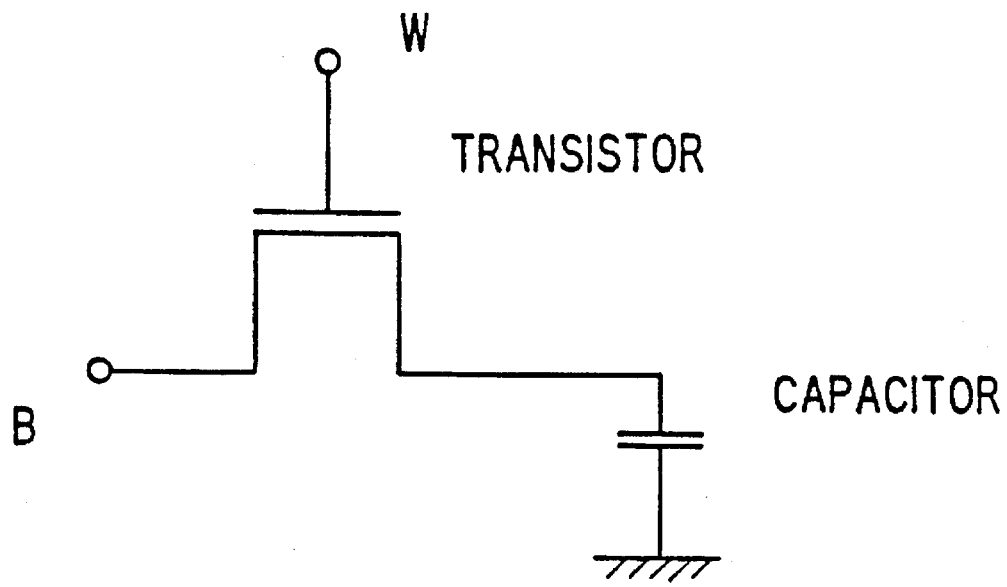
FIG. 17 is a conceptual diagram showing a prior art one-transistor memory cell.
Figure 18:
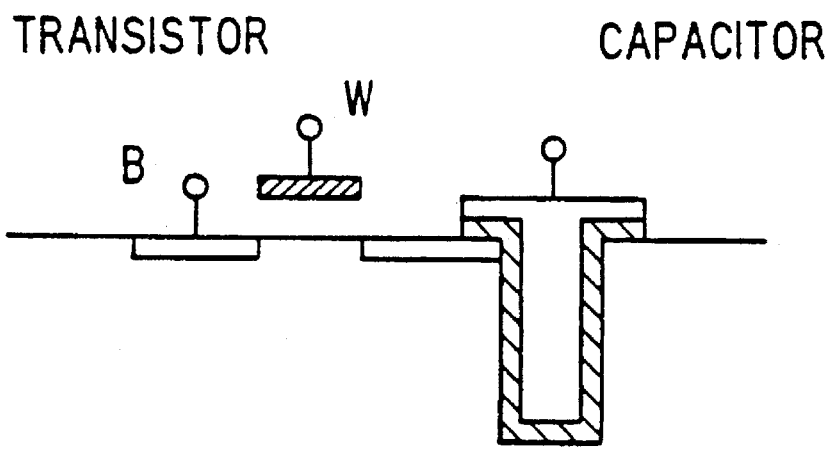
FIG. 18 is a cross-sectional view of a memory cell having a prior art trench capacitor cell structure.

"1" read: $V_{TH1\_1}$ The potential of the channel forming region $Ch_1$ is different between a "0" read and a "1" read. As a result, the threshold voltage of the information storage transistor $TR_1$ required at the first conductive gate $G_1$ differs between a "0" read and a "1" read. However, the structure does not require the provision of a large capacitor as required in the prior art DRAM shown in FIG. 17.

The potential of the information storage transistor $TR_1$ is set to satisfy the following relationship.

$$|V_{TH1\_1}|>|V_R|>|V_{TH1\_0}|$$

The operation of the semiconductor memory cell of Embodiment 5 will be described below.

Information write

When writing information "0" (second line potential: $V_0$) or "1" (second line potential: $V_1$), the potential of the first line is set at $V_W$ (<0). As a result, the potential at the second conductive gate $G_2$ of the switching transistor $TR_2$ is also $V_W$ (<0). Therefore, the switching transistor $TR_2$ is ON. Consequently, the potential of the channel forming region $Ch_1$ of the information storage transistor $TR_1$ is $V_0$ (when writing information "0") or $V_1$ (when writing information "1". Or $V_W - V_{TH2}$ when $|V_W|<|V_1+V_{TH2}|$).

When writing information, the potential at the first conductive gate $G_1$ of the information storage transistor $TR_1$ is $V_W$ (<0). Therefore, the information storage transistor $TR_1$ is OFF. Thus, when writing information "0" or "1", the potential of the channel forming region $Ch_1$ of the information storage transistor $TR_1$ is $V_0$ (when writing information "0") or $V_1$ or $V_W - V_{TH2}$ (when writing information "1"). This condition changes with time because of leakage currents (between the substrate and the semiconductor channel forming region $Ch_1$ of the information storage transistor $TR_1$, off currents of the switching transistor $TR_2$, etc.), but is maintained within an allowable range until the information is read out. More specifically, during the information retention period after the information is written and before the information is read out, the various portions of the information storage transistor $TR_1$ and the switching transistor $TR_2$ are set at such potentials that neither transistor will conduct. Furthermore, the so-call refresh operation is performed before the change in the potential of the channel forming region $Ch_1$ of the information storage transistor $TR_1$ becomes large enough to cause errors in read operations.

Information read

When reading information "0" or "1", the potential of the first line is $V_R$ (>0). As a result, the potential at the second conductive gate $G_2$ of the switching transistor $TR_2$ is $V_R$ (>0), and the switching transistor $TR_2$ is OFF.

The potential at the first conductive gate $G_1$ of the information storage transistor $TR_1$ is $V_R$ (>0). Also, the threshold voltage of the information storage transistor $TR_1$ required at the first conductive gate $G_1$ is $V_{TH1\_0}$ or $V_{TH1\_1}$. The threshold voltage of the information storage transistor $TR_1$ is dependent on the potential of the channel forming region $Ch_1$. The following relationship exists between these threshold voltages.

$$|V_{TH1\_1}|>|V_R|>|V_{TH1\_0}|$$

Therefore, when the stored information is "0", the information storage transistor $TR_1$ is ON. On the other hand, when the stored information is "1", the information storage transistor $TR_1$ is OFF.

Thus, the information storage transistor $TR_1$ is set to an ON or OFF condition, depending on the stored information. Since the first conductive region $SC_1$ of the information storage transistor $TR_1$ is connected to the read line or the second line, current flows or does not flow to the information storage transistor $TR_1$, depending on the stored information ("0" or "1"). The stored information can be read out in this manner by the information storage transistor $TR_1$. A mode in which the first conductive region $SC_1$ of the information storage transistor $TR_1$ is connected to the second line will be described hereinafter.

The above-described operating conditions of the information storage transistor $TR_1$ and the switching transistor $TR_2$ are summarized in Table 3. The potential values given in Table 3 are only illustrative examples, and each potential can take any value as long as it satisfies the above conditions.

TABLE 3

| | | | | Unit: volts |
|---|---|---|---|---|
| Memory write | "0" write | | "1" write | |
| 1st line potential | $V_W$ | −3.0 | $V_W$ | −3.0 |
| 2nd line potential | $V_0$ | 0 | $V_1$ | −2.0 |
| 2nd gate potential | $V_W$ | −3.0 | $V_W$ | −3.0 |
| Condition of $TR_2$ | ON | | ON | |
| Potential of channel forming region | $V_0$ | 0 | $V_1$ | −2.0 |
| 1st gate potential | $V_W$ | −3.0 | $V_W$ | −3.0 |
| Condition of $TR_1$ | OFF | | OFF | |
| Memory read | "0" read | | "1" read | |
| 1st line potential | $V_R$ | 1.0 | $V_R$ | 1.0 |
| 2nd gate potential | $V_R$ | 1.0 | $V_R$ | 1.0 |
| Condition of $TR_2$ | OFF | | OFF | |
| Potential of channel forming region | $V_0$ | 0 | $V_1$ | −2.0 |
| Threshold of $TR_1$ required at 1st gate | $V_{TH1\text{-}0}$ | 0.5 | $V_{TH1\text{-}1}$ | 1.1 |
| 1st gate potential | | 1.0 | | 1.0 |
| Condition of $TR_1$ | ON | | OFF | |
| Read line potential | 0.5 V* | | 0.5 V* | |

*2nd line potential: 1 V for FIG. 12 (c)

In Embodiment 5, it is possible to omit the read line. More specifically, the read line may be formed common with the second line. In this case, the first conductive region $SC_1$ is connected to the second line via a p-n junction or a Schottky junction type rectifying diode $D_2$, as indicated by a dotted line in FIG. 12(B). This semiconductor memory cell structure can be realized, for example, in the structure shown in FIG. 12(C). In the structure shown in FIG. 12(C), the diode $D_2$ is formed by forming the first conductive region $SC_1$ from a semiconductor and forming the third conductive region $SC_3$ in the surface area thereof, the conductivity type of the third conductive region $SC_3$ being opposite to that of the first conductive region $SC_1$. Furthermore, in the semiconductor memory cell shown in FIG. 12(C), the first semiconductor channel forming region $Ch_1$ and the fourth conductive region $SC_4$ are formed of a common region. Likewise, the first conductive region $SC_1$ and the second semiconductor channel forming region $Ch_2$ are formed of a common region.

In the thus structured semiconductor memory cell, the readout voltage applied to the second line must be small enough that a large forward current will not flow across the junction between the first conductive region $SC_1$ and the third conductive region $SC_3$ (0.4 V or less in the case of a p-n junction); otherwise, latch-up may occur. One way to prevent the latch-up condition is to form the third conductive region $SC_3$ from a silicide or a metal so that the third conductive region $SC_3$ and the first conductive region $SC_1$ form a junction such as a Schottky junction where majority carriers essentially form the forward current.

Figure 13:
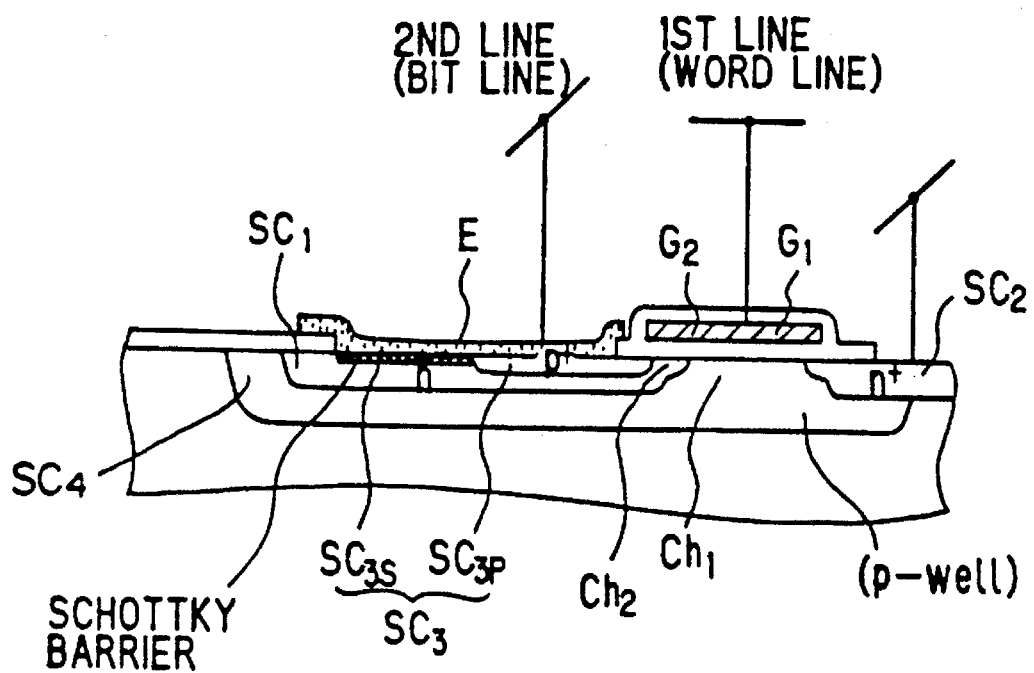
FIG. 13 is a schematic cross-sectional view of a portion of a semiconductor memory cell according to a modified example of the third aspect of the present invention.

As a structure that can utilize the conventional MOS technology, the third conductive region $SC_3$ may be formed, as shown in FIG. 13, for example, from a p-type semiconductor region $SC_{3P}$ and a metal layer of Mo, Al, etc. or a silicide layer, $SC_{3S}$, that can form a Schottky Junction with the first conductive region $SC_1$. In the semiconductor memory cell shown in FIG. 13, the first conductive gate $G_1$ and the second conductive gate $G_2$ are formed common. Also, the reference sign E designates an electrode Al or Al/TiN/Ti triple layer formed on the third conductive region $SC_3$, and the first conductive region $SC_1$ is formed, for example, from an n-type semiconductor.

Figure 12B:
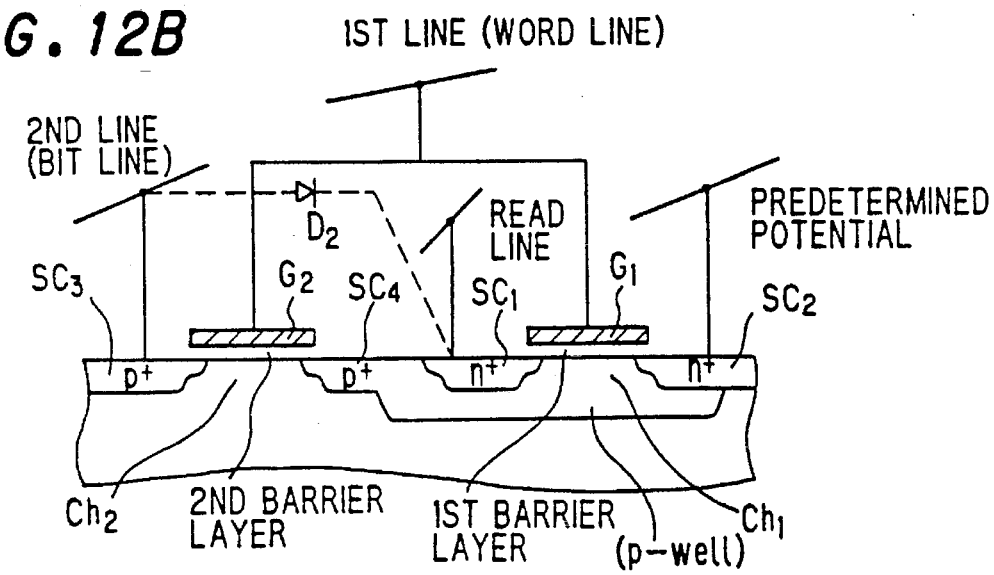
Figure 12C:
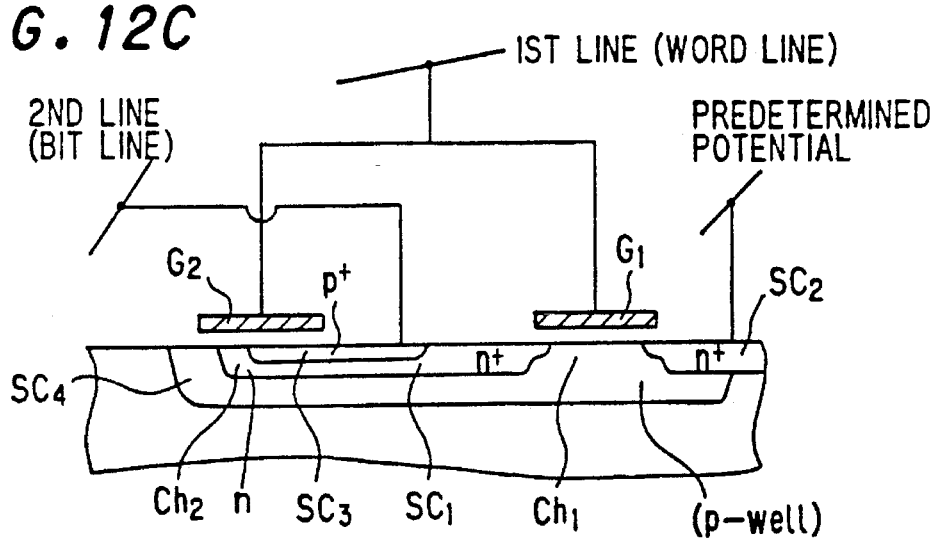

Thus, this embodiment provides the structure that can also be employed in CMOS fabrication, and therefore, the structure, among others, the structure shown in FIG. 12(B), is particularly suitable for DRAMs integrated in CMOS ASICs.

Embodiment 6

Figure 14A:
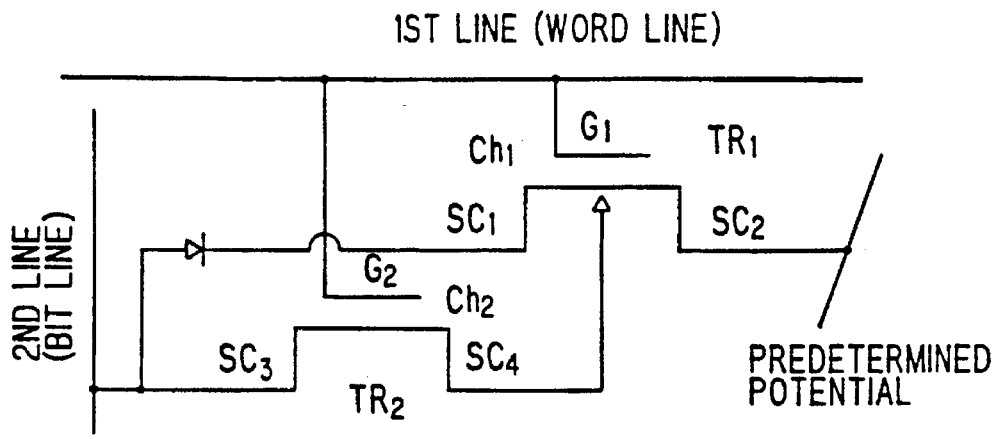
FIGS. 14A to 14C shows the principle of operation of a semiconductor memory cell according to a fourth aspect of the present invention along with schematic cross-sectional views showing a portion thereof.

Embodiment 6 is concerned with a semiconductor memory cell according to a fourth aspect of the invention. The semiconductor memory cell of Embodiment 6, the principle of operation of which is shown in FIG. 14(A) and a cross section of a portion of which is shown schematically in FIG. 13(B), comprises an information storage transistor $TR_1$ of a first conductivity type (for example, n type) and a switching transistor $TR_2$ of a second conductivity type (for example, p type) opposite to the first conductivity type.

Figure 14B:
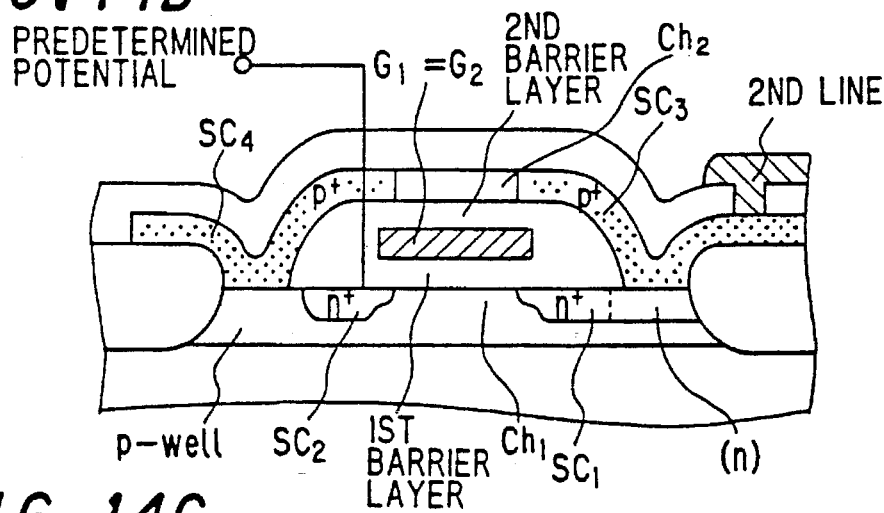

The information storage transistor $TR_1$ comprises a first conductive gate $G_1$, first and second conductive regions, $SC_1$ and $SC_2$, formed, for example, from an $n^+$ semiconductor, and a first semiconductor channel forming region $Ch_1$ (common with a p-well in the example shown in FIG. 14(B)). The first conductive region $SC_1$ and the second conductive region $SC_2$ each form a rectifier junction with the surface area of the first semiconductor channel forming region $Ch_1$. The first conductive gate $G_1$ is formed opposite a first principal surface of the first semiconductor channel forming region $Ch_1$, with a first barrier layer interposed therebetween, in such a manner as to bridge the first and second conductive regions $SC_1$ and $SC_2$.

The switching transistor $TR_2$ comprises a second conductive gate $G_2$, third and fourth conductive regions, $SC_3$ and $SC_4$, formed, for example, from a $p^+$ semiconductor, and a second semiconductor channel forming region $Ch_2$. The third conductive region $SC_3$ and the fourth conductive region $SC_4$ are connected to the second semiconductor channel forming region $Ch_2$. The second conductive gate $G_2$ is formed opposite a second principal surface of the second semiconductor channel forming region $Ch_2$ with a second barrier layer interposed therebetween.

The first conductive gate $G_1$ of the information storage transistor $TR_1$ and the second conductive gate $G_2$ of the switching transistor $TR_2$ are connected to a first memory-cell-selection line (for example, a word line). The fourth conductive region $SC_4$ of the switching transistor $TR_2$ is connected to the channel forming region $Ch_1$ of the information storage transistor $TR_1$. The third conductive region $SC_3$ of the switching transistor $TR_2$ is connected to a second memory-cell-selection line (for example, a bit line). The second conductive region $SC_2$ of the information storage transistor $TR_1$ is connected to a fixed potential. The first conductive region $SC_1$ of the information storage transistor $TR_1$ is connected to the third conductive region $SC_3$ of the switching transistor $TR_2$, forming at their boundary a rectifier junction of p-n junction or Schottky junction type. With the impurity concentration in the first conductive region $SC_1$ at the junction adjusted to $2\times10^{19} cm^{-3}$ or less, the dielectric strength or leakage current characteristic at the rectifier junction can be improved.

Potentials applied to the various lines for a memory write are designated as follows:

First memory-cell-selection line (e.g., word line): $V_W$

Second memory-cell-selection line (e.g., bit line)

"0" write: $V_0$

"1" write: $V_1$

Read potential is designated as follows:

First memory-cell-selection line (e.g., word line): $V_R$

Also, for a memory read, the fixed potential to which the second conductive region $SC_2$ of the information storage transistor $TR_1$ is connected is designated as follows:

Fixed potential: $V_2$

The threshold voltages of the information storage transistor $TR_1$ required at the first conductive gate $G_1$ for read operations are designated as follows:

"0" read: $V_{TH1\_0}$

"1" read: $V_{TH1\_1}$

The potential of the channel forming region $Ch_1$ is different between a "0" read and a "1" read. As a result, the threshold voltage of the information storage transistor $TR_1$ required at the first conductive gate $G_1$ differs between a "0" read and a "1" read. However, the structure does not require the provision of a large capacitor as required in the prior art DRAM.

The potential of the information storage transistor $TR_1$ is set to satisfy the following relationship.

$$|V_{TH1\_1}|>|V_R|>|V_{TH1\_0}|$$

The operation of the semiconductor memory cell of Embodiment 6 will be described below.

Information write

When writing information "0" (second line potential: $V_0$) or "1" (second line potential: $V_1$), the potential of the first line is set at $V_W$ (<0). As a result, the potential at the second conductive gate $G_2$ of the switching transistor $TR_2$ is also $V_W$ (<0). Therefore, the switching transistor $TR_2$ is ON. Consequently, the potential of the channel forming region $Ch_1$ of the information storage transistor $TR_1$ is $V_0$ (when writing information "0") or $V_1$ (when writing information "1". Or $V_W-V_{TH2}$ when $|V_W|<|V_1+V_{TH2}|$).

When writing information, the potential at the first conductive gate $G_1$ of the information storage transistor $TR_1$ is $V_W$ (<0). Therefore, the information storage transistor $TR_1$ is OFF. Thus, when writing information "0" or "1", the potential of the channel forming region $Ch_1$ of the information storage transistor $TR_1$ is $V_0$ (when writing information "0") or $V_1$ or $V_W-V_{TH2}$ (when writing information "1"). This condition changes with time because of leakage currents (between the substrate and the semiconductor channel forming region $Ch_1$ of the information storage transistor $TR_1$, off currents of the switching transistor $TR_2$, etc.), but is maintained within an allowable range until the information is read out. More specifically, during the information retention period after the information is written and before the information is read out, the various portions of the information storage transistor $TR_1$ and the switching transistor $TR_2$ are set at such potentials that neither transistor will conduct. Furthermore, the so-call refresh operation is performed before the change in the potential of the channel forming region $Ch_1$ of the information storage transistor $TR_1$ becomes large enough to cause errors in read operations.

The first conductive region $SC_1$ of the information storage transistor $TR_1$ is connected to the third conductive region $SC_3$ of the switching transistor $TR_2$, forming at their boundary a rectifier junction of p-n junction or Schottky junction type. This perfectly prevents the current flow to the first conductive region $SC_1$ during the writing of information.

Information read

When reading information "0" or "1", the potential of the first line is $V_R$ (>0). As a result, the potential at the second conductive gate $G_2$ of the switching transistor $TR_2$ is $V_R$ (>0), and the switching transistor $TR_2$ is OFF.

The potential at the first conductive gate $G_1$ of the information storage transistor $TR_1$ is $V_R$ (>0). Also, the threshold voltage of the information storage transistor $TR_1$ required at the first conductive gate $G_1$ is $V_{TH1\_0}$ or $V_{TH1\_1}$. The threshold voltage of the information storage transistor $TR_1$ is dependent on the potential of the channel forming region $Ch_1$. The following relationship exists between these threshold voltages.

$$|V_{TH1\_1}|>|V_R|>|V_{TH1\_0}|$$

Therefore, when the stored information is "0", the information storage transistor $TR_1$ is ON. On the other hand, when the stored information is "1", the information storage transistor $TR_1$ is OFF.

Thus, the information storage transistor $TR_1$ is set to an ON or OFF condition, depending on the stored information. Since the second conductive region $SC_2$ of the information storage transistor $TR_1$ is connected to the fixed potential, current flows or does not flow to the information storage transistor $TR_1$, depending on the stored information ("0" or "1"). The stored information can be read out in this manner by the information storage transistor $TR_1$. The above-described operating conditions of the information storage transistor $TR_1$ and the switching transistor $TR_2$ are summarized in Table 4. The potential values given in Table 4 are only illustrative examples, and each potential can take any value as long as it satisfies the above conditions.

TABLE 4

| | | | Unit: volts | |
|---|---|---|---|---|
| Memory write | "0" write | | "1" write | |
| 1st line potential | $V_W$ | −2.5 | $V_W$ | −2.5 |
| 2nd line potential | $V_0$ | 0 | $V_1$ | −2.0 |
| 2nd gate potential | $V_W$ | −2.5 | $V_W$ | −2.5 |
| Condition of $TR_2$ | ON | | ON | |
| Potential of $TR_1$ channel forming region | $V_0$ | 0 | $V_1$ | −1.0 |
| 1st gate potential | $V_W$ | −2.5 | $V_W$ | −2.5 |
| Condition of $TR_1$ | OFF | | OFF | |
| Memory read | "0" read | | "1" read | |
| 1st line potential | $V_R$ | 0.9 | $V_R$ | 0.9 |
| 2nd gate potential | $V_R$ | 0.9 | $V_R$ | 0.9 |
| Condition of $TR_2$ | OFF | | OFF | |
| Potential of $TR_1$ channel forming region | $V_0$ | 0 | $V_1$ | −2.0 |
| Threshold of $TR_1$ required at 1st gate | $V_{TH1\_0}$ | 0.5 | $V_{TH1\_1}$ | 1.1 |
| 1st gate potential | | 0.9 | | 0.9 |
| Condition of $TR_1$ | ON | | OFF | |
| 2nd line potential | $V_2$ (≅1.0) | | $V_2$ (≅1.0) | |

Figure 14C:
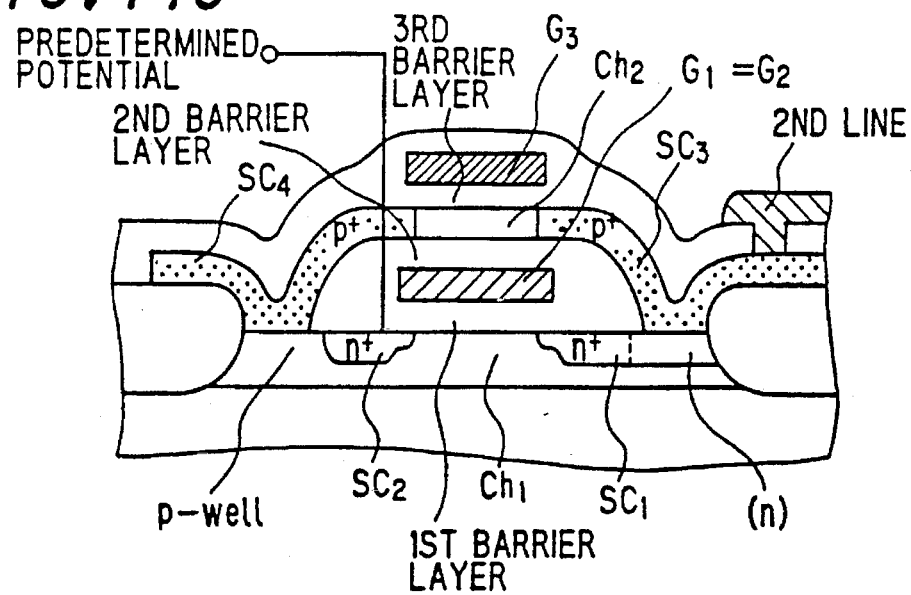

FIG. 14(C) shows a modified example of the semiconductor memory cell of Embodiment 6. In the semiconductor memory cell shown in FIG. 14(C), an auxiliary gate (a third conductive gate) $G_3$ is formed opposite the second conductive gate $G_2$ and facing a third principal surface of the second semiconductor channel forming region $Ch_2$ with a third barrier layer interposed therebetween. The auxiliary gate $G_3$ has the function of shielding the semiconductor forming region $Ch_2$ from potentials induced at and ions adhering to the surface of the semiconductor memory cell, thereby ensuring stable operation of the semiconductor memory cell. Furthermore, by connecting the auxiliary gate $G_3$ to the read/write selection line, read or write operating margins can be improved. The semiconductor memory cell thus constructed has further improved characteristics as compared with the semiconductor memory cell whose principle of operation is shown in FIG. 4.

Embodiment 7

Figure 15A:
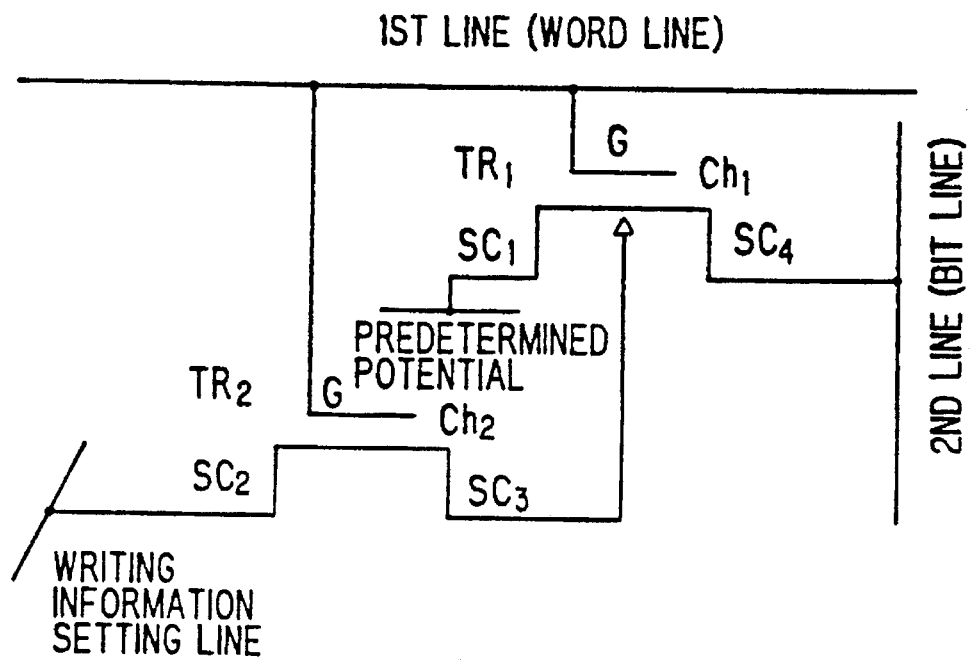
FIGS. 15A and 15B shows the principle of operation of a semiconductor memory cell according to a fifth aspect of the present invention along with a schematic cross-sectional view showing a portion thereof.
Figure 15B:
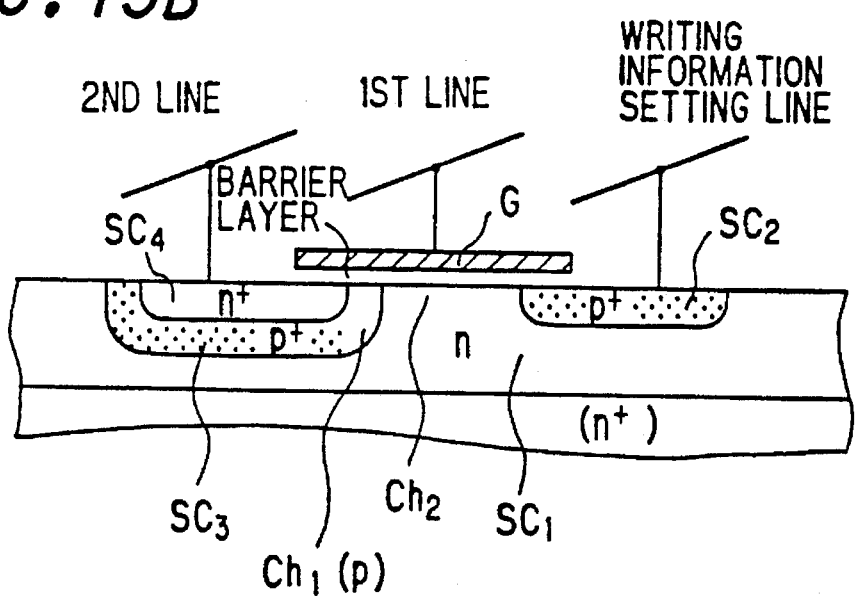

Embodiment 7 is concerned with a semiconductor memory cell according to a fifth aspect of the invention. The semiconductor memory cell of Embodiment 7, the principle of operation of which is shown in FIG. 15(A) and a cross section of a portion of which is shown schematically in FIG. 15(B), comprises: a first semiconductor region $SC_1$ of a first conductivity type (for example, n type); a first conductive region $SC_2$ formed from a material of a second conductivity type opposite to the first conductivity type (for example, $p^+$) or from other material such as a metal or a silicide that forms a rectifier junction with the first semiconductor region $SC_1$; a second semiconductor region $SC_3$ of the second conductivity type (for example, $p^+$ type); a second conductive region $SC_4$ formed from a material of the first conductivity type (for example, $n^+$) or from other material such as a metal or a silicide that forms a rectifier junction with the second semiconductor region $SC_3$; and a conductive gate G disposed in such a manner as to form a bridge over a barrier layer between the first semiconductor region $SC_1$ and the second conductive region $SC_4$ and between the first conductive region $SC_2$ and the second semiconductor region $SC_3$.

The first semiconductor region $SC_1$ is formed in the surface area of a semiconductor substrate or on an insulating substrate. The first conductive region $SC_2$ is formed in the surface area of the first semiconductor region $SC_1$. The second semiconductor region $SC_3$ is formed in the surface area of the first semiconductor region $SC_1$ but spaced apart from the first conductive region $SC_2$. The second conductive region $SC_4$ is formed in the surface area of the second semiconductor region $SC_3$.

The conductive gate G is connected to a first memory-cell-selection line (for example, a word line). The first conductive region $SC_2$ is connected to a write information setting line. The second conductive region $SC_4$ is connected to a second memory-cell-selection line (for example, a bit line).

The first semiconductor region $SC_1$ (corresponding to the channel forming region $Ch_2$), the first conductive region $SC_2$ (corresponding to a source/drain region), the second semiconductor region $SC_3$ (corresponding to a source/drain region), and the conductive gate G constitute the switching transistor $TR_2$. Likewise, the second semiconductor region $SC_3$ (the surface area below the conductive gate G corresponds to the channel forming region $Ch_1(p)$), the first semiconductor region $SC_1$ (corresponding to a source/drain region), the second conductive region $SC_4$ (corresponding to a source/drain region), and the conductive gate G constitute the information storage transistor $TR_1$.

Potentials applied to the various lines for a memory write are designated as follows:

First memory-cell-selection line (e.g., word line): $V_W$
Write information setting line
   "0" write: $V_0$
   "1" write: $V_1$ Read potential is designated as follows:
First memory-cell-selection line (e.g., word line): $V_R$
Also, for a memory read, the potential of the second memory-cell-selection line (for example, bit line) to which the second conductive region $SC_4$ is connected is designated as follows:

Second memory-cell-selection line: $V_2$
A fixed potential, including zero potential, is applied to the first semiconductor region $SC_1$.

The threshold voltages of the information storage transistor $TR_1$ required at the conductive gate G for read operations are designated as follows:
   "0" read: $V_{TH1\_0}$
   "1" read: $V_{TH1\_1}$ The potential of the channel forming region $Ch_1$ is different between a "0" read and a "1" read. As a result, the threshold voltage of the information storage transistor $TR_1$ at the conductive gate G differs between a "0" read and a "1" read. However, the structure does not require the provision of a large capacitor as required in the prior art DRAM.

The potential of the information storage transistor $TR_1$ is set to satisfy the following relationship.

$$|V_{TH1\_1}| > |V_R| > |V_{TH1\_0}|$$

The operation of the semiconductor memory cell of Embodiment 7 will be described below.

Information write

When writing information "0" (write information setting line potential: $V_0$) or "1" (write information setting line potential: $V_1$), the potential of the first line is set at $V_W$ (<0). As a result, the potential at the conductive gate G of the switching transistor $TR_2$ is also $V_W$ (<0). Therefore, the switching transistor $TR_2$ is ON. Consequently, the potential of the channel forming region $Ch_1$ of the information storage transistor $TR_1$ is $V_0$ (when writing information "0") or $V_1$ (when writing information "1". Or $V_W$–$V_{TH2}$ when $|V_W| < |V_1 + V_{TH2}|$).

During the information retention period after the information is written and before the information is read out, the various portions of the information storage transistor $TR_1$ and the switching transistor $TR_2$ are set at such potentials that neither transistor will conduct. To achieve this, the potential of the first line should be set at 0 (V) and the potential of the second line at $V_1$, for example.

When writing information, the potential at the conductive gate G of the information storage transistor $TR_1$ is $V_W$ (<0). Therefore, the information storage transistor $TR_1$ is OFF. Thus, when writing information "0" or "1", the potential of the channel forming region $Ch_1$ of the information storage transistor $TR_1$ is $V_0$ (when writing information "0") or $V_1$ or $V_W$–$V_{TH2}$ (when writing information "1"). This condition changes with time because of leakage currents (between the first semiconductor region $SC_1$ and the semiconductor channel forming region $Ch_1$ of the information storage transistor $TR_1$, off currents of the switching transistor $TR_2$, etc.), but is maintained within an allowable range until the information is read out. The so-call refresh operation is performed before the change in the potential of the channel forming region $Ch_1$ of the information storage transistor $TR_1$ becomes large enough to cause errors in read operations.

Information read

When reading information "0" or "1", the potential of the first line is $V_R$ (>0). As a result, the potential at the conductive gate G of the switching transistor $TR_2$ is $V_R$ (>0), and the switching transistor $TR_2$ is OFF.

The potential at the conductive gate G of the information storage transistor $TR_1$ is $V_R$ (>0). Also, the threshold voltage of the information storage transistor $TR_1$ required at the conductive gate G is $V_{TH1\_0}$ or $V_{TH1\_1}$. The threshold voltage of the information storage transistor $TR_1$ is dependent on the potential of the channel forming region $Ch_1$. The following relationship exists between these potentials.

$$|V_{TH1\_1}| > |V_R| > |V_{TH1\_0}|$$

Therefore, when the stored information is "0", the information storage transistor $TR_1$ is ON. On the other hand, when the stored information is "1", the information storage transistor $TR_1$ is OFF.

Thus, the information storage transistor $TR_1$ is set to an ON or OFF condition, depending on the stored information. Since the second conductive region $SC_4$ is connected to the second line, current flows or does not flow to the information storage transistor $TR_1$, depending on the stored information ("0" or "1"). The stored information can be read out in this manner by the information storage transistor $TR_1$.

The above-described operating conditions of the information storage transistor $TR_1$ and the switching transistor $TR_2$ are summarized in Table 5. The potential values given in Table 5 are only illustrative examples, and each potential can take any value as long as it satisfies the above conditions.

TABLE 5

Unit: volts

| Memory write | "0" write | | "1" write | |
|---|---|---|---|---|
| 1st line potential | $V_W$ | −3.0 | $V_W$ | −3.0 |
| Potential of write information setting line | $V_0$ | 0 | $V_1$ | −2.0 |
| Gate potential | $V_W$ | −3.0 | $V_W$ | −3.0 |
| Condition of $TR_2$ | ON | | ON | |
| Potential of channel forming region | $V_0$ | 0 | $V_1$ | −2.0 |
| Condition of $TR_1$ | OFF | | OFF | |
| Memory read | "0" read | | "1" read | |
| 1st line potential | $V_R$ | 1.0 | $V_R$ | 1.0 |
| Gate potential | $V_R$ | 1.0 | $V_R$ | 1.0 |
| Condition of $TR_2$ | OFF | | OFF | |
| Potential of channel forming region | $V_0$ | 0 | $V_1$ | −2.0 |
| Threshold of $TR_1$ required at 1st gate | $V_{TH1\text{-}0}$ | 0.5 | $V_{TH1\text{-}1}$ | 1.1 |
| Condition of $TR_1$ | ON | | OFF | |
| 2nd line potential | 0.5 | | 0.5 | |

Embodiment 8

Figure 16A:
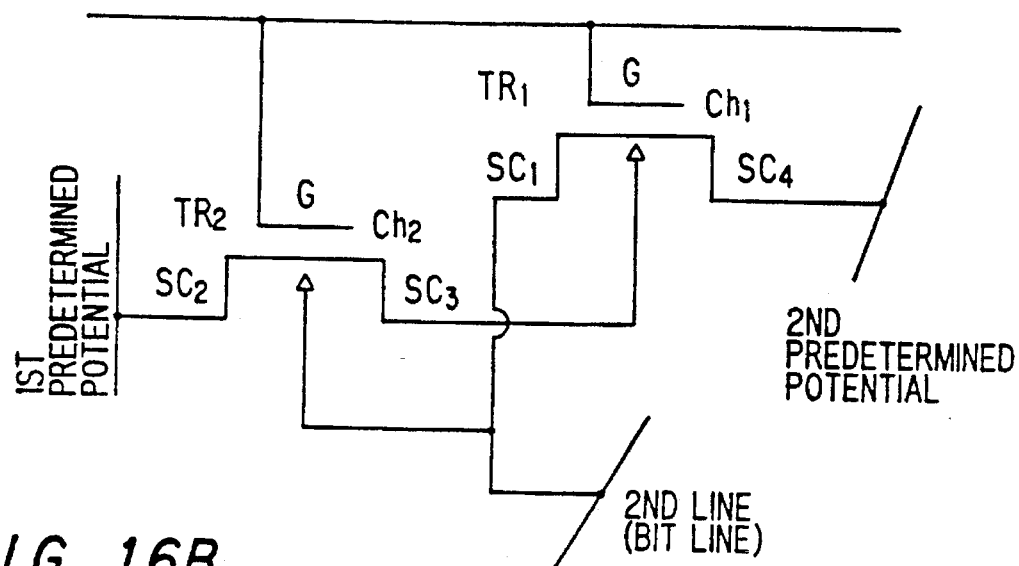
FIGS. 16A to 16C shows the principle of operation of a semiconductor memory cell according to a sixth aspect of the present invention along with schematic cross-sectional views showing a portion thereof.
Figure 16B:
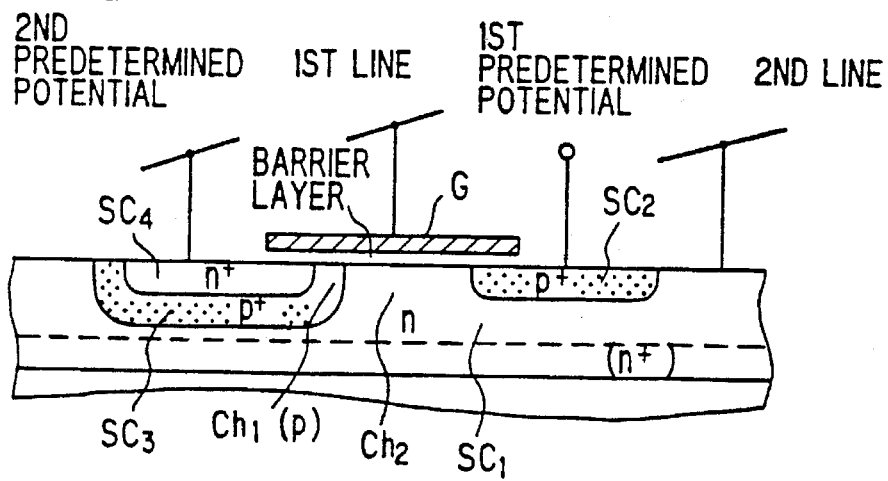
Figure 16C:
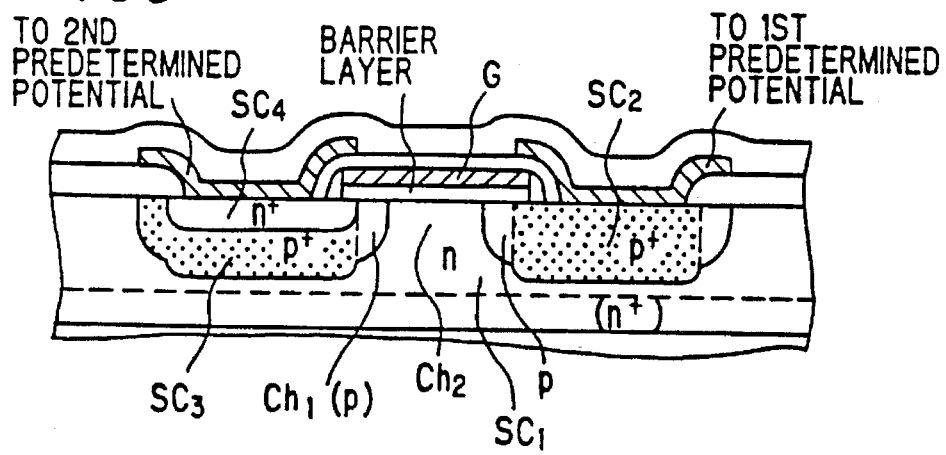

Embodiment 8 is concerned with a semiconductor memory cell according to a sixth aspect of the invention. The semiconductor memory cell of Embodiment 8, the principle of operation of which is shown in FIG. 16(A) and a cross section of a portion of which is shown schematically in FIG. 16(B), comprises: a first semiconductor region $SC_1$ of a first conductivity type (for example, n type); a first conductive region $SC_2$ formed from a material of a second conductivity type opposite to the first conductivity type (for example, $p^+$) or from other material such as a metal or a silicide that forms a rectifier junction with the first semiconductor region $SC_1$); a second semiconductor region $SC_3$ of the second conductivity type (for example, $p^+$ type); a second conductive region $SC_4$ formed from a material of the first conductivity type (for example, $n^+$) or from other material such as a metal or a silicide that forms a rectifier Junction with the second semiconductor region $SC_3$); and a conductive gate G formed in such a manner as to bridge the second conductive region $SC_4$ and a portion of the first semiconductor region $SC_1$ flanked by the second semiconductor region $SC_3$ and the first conductive region $SC_2$ and also bridge the first conductive region $SC_2$ and the second semiconductor region $SC_3$. The semiconductor memory cell shown in FIG. 16(B) is depicted in more detail in FIG. 16(C). For further embodiment of the semiconductor memory cell structure shown in FIG. 15(B), part of the structure of the semiconductor memory cell structure shown in FIG. 16(C) can be applied to the structure shown in FIG. 15(B).

The first semiconductor region $SC_1$ is formed on a semiconductor substrate as an isolated region in the surface area thereof, or on an insulating substrate as a region attached to a support substrate with an insulating layer such as an $SiO_2$ layer interposed therebetween. The first conductive region $SC_2$ is formed in the surface area of the first semiconductor region $SC_1$. The second semiconductor region $SC_3$ is formed in the surface area of the first semiconductor region $SC_1$ but spaced apart from the first conductive region $SC_2$. The second conductive region $SC_4$ is formed in the surface area of the second semiconductor region $SC_3$.

The conductive gate G is connected to a first-memory-cell selection line (for example, a word line). The first semiconductor region $SC_1$ is connected to a second memory-cell-selection line (for example, a bit line). The first conductive region $SC_2$ is connected to a first fixed potential. The second conductive region $SC_4$ is connected to a second fixed potential.

The first semiconductor region $SC_1$ (corresponding to the channel forming region $Ch_2$), the first conductive region $SC_2$ (corresponding to a source/drain region), the second semiconductor region $SC_3$ (corresponding to a source/drain region), and the conductive gate G constitute the switching transistor $TR_2$. Likewise, the second semiconductor region $SC_3$ (the surface area below the conductive gate G corresponds to the channel forming region $Ch_1(p)$), the first semiconductor region $SC_1$ (corresponding to a source/drain region), the second conductive region $SC_4$ (corresponding to a source/drain region), and the conductive gate G constitute the information storage transistor $TR_1$.

The first fixed potential to which the first conductive region $SC_2$ is connected is designated as $V_3$ ($\leq 0$). Likewise, the second fixed potential to which the second conductive region $SC_4$ is connected is designated as $V_4$ ($\geq 0$).

Potentials applied to the various lines for a memory write are designated as follows:

First memory-cell-selection line (e.g., word line): $V_W$

Second memory-cell-selection line (e.g., bit line)

"0" write: $V_0$

"1" write: $V_1$

Likewise, the threshold voltages of the switching transistor $TR_2$ required at the conductive gate for write operations are designated as follows: "0" write: $V_{TH2W\_0}$ "1" write: $V_{TH2W\_1}$ Read potential is designated as follows:

First memory-cell-selection line (e.g., word line): $V_R$

Also, the threshold voltages of the information storage transistor $TR_1$ required at the conductive gate G for read operations are designated as follows:

"0" read: $V_{TH1R\_0}$

"1" read: $V_{TH1R\_1}$

Generally, the potentials of the channel forming regions $Ch_1$ and $Ch_2$ are different between a "0" read/write and a "1" read/write. As a result, the threshold voltages of the information storage transistor $TR_1$ and the switching transistor $TR_2$ required at the conductive gate G differ between a "0" read/write and a "1" read/write. However, the structure does not require the provision of a large capacitor as required in the prior art DRAM.

The potential at the conductive gate of the switching transistor $TR_2$, relative to $V_W$, is set as shown below, for example, for simplicity of explanation.

$|V_W|>|V_{TH2W\_1}|$ or $|V_{TH2W\_0}|$ whichever larger

The potential at the conductive gate of the information storage transistor $TR_1$, relative to $V_R$, is set as follows:

$|V_{TH1\_1}|>|V_R|>|V_{TH1\_0}|$

The operation of the semiconductor memory cell of Embodiment 8 will be described below.

Information write

When writing information "0" (second line potential: $V_0$) or "1" (second line potential: $V_1$), the potential of the first line is set at $V_W$ (<0). As a result, the potential at the conductive gate G of the switching transistor $TR_2$ is also $V_W$ (<0). $V_W$ is $$|V_W|>|V_{TH2W\_1}| \text{ or } |V_{TH2W\_0}| \text{ whichever larger}$$

Therefore, for a write operation, the switching transistor $TR_2$ is ON. Consequently, the potential of the channel forming region $Ch_1$ of the information storage transistor $TR_1$ is "0" information write: $V_3$
"1" information write: $V_3$ When writing information, the potential at the conductive gate G of the information storage transistor $TR_1$ is $V_W$ (<0). Therefore, the information storage transistor $TR_1$ is OFF. Thus, when writing information "0" or "1", the potential of the channel forming region $Ch_1$ of the information storage transistor $TR_1$ is $V_3$ for both "0" and "1" information write. During the retention period, since $TR_2$ is also OFF, when the second line potential at this time is denoted by $V_5$ ($|V_5| \le |V_0|$ or $|V_1|$) the potential of the first semiconductor channel $Ch_1$ is $\gamma\{V_3-(V_0-V_5)\}$ or $\gamma\{V_3-(V_1-V_5)\}$, where $\gamma$ is the ratio of the capacitance between the first semiconductor region $SC_1$ and the second semiconductor region $SC_3$ to the total capacitance between the second semiconductor region $SC_3$ and the other areas (including the first semiconductor region $SC_1$) than the second semiconductor region $SC_3$. This condition changes with time because of leakage currents (between the first semiconductor region $SC_1$ and the semiconductor channel forming region $Ch_1$ of the information storage transistor $TR_1$, off currents of the switching transistor $TR_2$, etc.), but is maintained within an allowable range until the information is read out.

During the information retention period after the information is written and before the information is read out, the various portions of the information storage transistor $TR_1$ and the switching transistor $TR_2$ are set at such potentials that neither transistor will conduct. To achieve this the potential of the first line should be set at 0 (V) and the potential of the second line at $V_5$, for example. The so-called refresh operation is performed before the change in the potential of the channel forming region $Ch_1$ of the information storage transistor $TR_1$ becomes large enough to cause errors in read operations.

Information read

When reading information "0" or "1", the potential of the first line is $V_R$ (>0), and the potential of the second line is $V_6$ ($|V_6| \le |V_0|$ or $|V_1|$). As a result, the potential at the conductive gate G of the switching transistor $TR_2$ is $V_R$ (>0), and the switching transistor $TR_2$ is OFF.

The potential at the conductive gate G of the information storage transistor $TR_1$ is $V_R$ (>0). Also, the threshold voltage of the information storage transistor $TR_1$ required at the first conductive gate $G_1$ is $V_{TH1R\_0}$ or $V_{TH1R\_1}$ which is given by the potential between the second semiconductor region $SC_3$ and the second conductive region $SC_4$ when $\gamma\{V_3-(V_0-V_6)\}$ or $\gamma\{V_3-(V_1-V_6)\}$ is met. The threshold voltage of the information storage transistor $TR_1$ is dependent on the potential of the channel forming region $Ch_1$. The following relationship exists between these potentials.

$$|V_{TH1\_0}|>|V_R|>|V_{TH1\_1}|$$

Therefore, when the stored information is "0", the information storage transistor $TR_1$ is OFF. On the other hand, when the stored information is "1", the information storage transistor $TR_1$ is ON.

Thus, the information storage transistor $TR_1$ is set to an ON or OFF condition, depending on the stored information.

Since the second conductive region $SC_4$ is connected to the second fixed potential, current flows or does not flow to the information storage transistor $TR_1$, depending on the stored information ("0" or "1"). The stored information can be read out in this manner by the information storage transistor $TR_1$.

The above-described operating conditions of the information storage transistor $TR_1$ and the switching transistor $TR_2$ are summarized in Table 6. The potential values given in Table 6 are only illustrative examples, and each potential can take any value as long as it satisfies the above conditions.

TABLE 6

Unit: volts

| Memory write | "0" write | | "1" write | |
|---|---|---|---|---|
| 1st line potential | $V_W$ | −2.0 | $V_W$ | −2.0 |
| 2nd line potential | $V_0$ | 2.0 | $V_1$ | 0 |
| 1st fixed potential | | $V_2$ | | $V_2$ |
| Gate potential | $V_W$ | −2.0 | $V_W$ | −2.0 |
| Threshold of $TR_2$ required at gate | $V_{TH2W\text{-}0}$ | −1.2 | $V_{TH2W\text{-}1}$ | −0.5 |
| Condition of $TR_2$ | ON | | ON | |
| Potential of $TR_1$ channel forming region | 1st fixed potential e.g. 0 | | 1st fixed potential e.g. 0 | |
| Condition of $TR_1$ | OFF | | OFF | |

| Memory read | "0" read | | "1" read | |
|---|---|---|---|---|
| 1st line potential | $V_R$ | 1.0 | $V_R$ | 1.0 |
| Gate potential | $V_R$ | 1.0 | $V_R$ | 1.0 |
| Condition of $TR_2$ | OFF | | OFF | |
| Potential of $TR_1$ channel forming region | | −0.75 | | +0.25 |
| Threshold of $TR_1$ required at 1st gate | $V_{TH1R\text{-}0}$ | 0.85 | $V_{TH1R\text{-}1}$ | 0.5 |
| Condition of $TR_1$ | OFF | | ON | |
| 2nd line potential | 0.5 | | 0.5 | |
| 2nd fixed potential | 0.25 | | 0.25 | |

The semiconductor memory cell of the invention has been described above in accordance with preferred embodiments, but it will be appreciated that the invention is not limited to those described preferred embodiments. For example, in the first and second aspects of the invention described in Embodiments 1 and 3, the information storage transistor $TR_1$ and the switching transistor $TR_1$ may be both formed from p-type transistors. Furthermore, in the preferred modes of the first and second aspects of the invention described in Embodiments 2 and 4, the information storage transistor $TR_1$ may be formed from an n-type transistor and the switching transistor $TR_2$ from a p-type transistor. Moreover, in the third to fifth aspects described in Embodiments 5 to 8, the information storage transistor $TR_1$ may be formed from a p-type transistor and the switching transistor $TR_2$ from an n-type transistor. It will also be appreciated that the arrangement of elements in each transistor shown is only illustrative and may be modified as needed.

The present invention is applicable not only to memory cells formed from silicon semiconductors but also to memory cells formed from compound semiconductors such as GaAs, for example.

In the semiconductor memory cell of the present invention, the operation of the information storage transistor is determined in depending relationship on the potential or charge (information) stored on the second conductive gate or in the channel forming region of the information storage transistor, and the information read out as the transistor current during refresh intervals is independent of the magnitude of the capacitance of a capacitor (for example, the capacitance of the second conductive gate plus added capacitance, etc.) if such a capacitor is added. This therefore serves to solve the problem of capacitor capacitance encountered in prior art semiconductor memory cells; if a capacitor is added for refresh interval adjustment, a very large capacitor such as those required in the prior art DRAMs is not required. Furthermore, the maximum area of the semiconductor memory cell is equal to or smaller than the area of two transistors.

In the semiconductor memory cell according to the first and second aspects of the invention, a conductive gate is provided opposite each of two principal surfaces of the semiconductor channel layer of the information storage transistor. This structure eliminates the problem of unstable transistor operation inherent in prior art transistor structures; that is, the structure of the invention is effective in stabilizing the operation of the information storage transistor, and facilitates short-channel transistor design. The first conductive gate and the third conductive gate are both connected to the first memory-cell-selection line. Accordingly, the first memory-cell-selection line need not be provided more than one, and the chip area can be reduced. Furthermore, depending on the structure, it is possible to form a memory cell within an area equal to one transistor area.

In the semiconductor memory cell according to the second aspect of the invention, a fourth gate is provided as an extra gate of the switching transistor. The provision of this extra gate serves to further stabilize the operation of the switching transistor.

In the preferred modes of the semiconductor memory cell according to the first and second aspects of the invention, a fifth conductive layer is provided. The provision of this fifth conductive layer prevents without fail a current from flowing to the information storage transistor during the information write operation.

The semiconductor memory cell fabrication process according to the third aspect of the invention is compatible with the fabrication process for CMOS ASICs, as shown, for example, in FIG. 12(B). The process therefore allows DRAM functions to be incorporated in an ASIC without requiring extra processing steps although the semiconductor memory cell area increases slightly. On the other band, in the semiconductor memory cell structure shown in FIG. 12(C), for example, one extra processing step may be required as compared to the CMOS ASIC structure, but the semiconductor memory cell area can be reduced nearly by half.

According to the fourth aspect of the invention, the semiconductor memory cell can be implemented on an area approximately equal to one transistor area.

According to the fifth and sixth aspects of the invention, the semiconductor memory cell can be implemented on an area approximately equal to one transistor area by using conventional semiconductor memory cell fabrication techniques without relying on SOI technology.

What is claimed is:

1. A semiconductor memory cell comprising:

an information storage transistor of a first conductivity type, comprising a first semiconductor channel forming region; first and second conductive regions each forming a rectifier junction in contacting relationship with a surface region of said first semiconductor channel forming region; and a first conductive gate disposed above said first channel forming region, with a first barrier layer interposed therebetween, in such a manner as to bridge said first conductive region and said second conductive region, and a switching transistor of a second conductivity type opposite to the first conductivity type, comprising a second semiconductor channel forming region; third and fourth conductive regions each forming a rectifier junction in contacting relationship with a surface region of said second semiconductor channel forming region; and a second conductive gate disposed above said second semiconductor channel forming region, with a second barrier layer interposed therebetween, in such a manner as to bridge said third conductive region and said fourth conductive region, wherein said first conductive gate of said information storage transistor and said second conductive gate of said switching transistor are connected to a first memory-cell-selection line;

said fourth conductive region of said switching transistor is connected to said first semiconductor channel forming region of said information storage transistor;

said third conductive region of said switching transistor is connected to a second memory-cell-selection line, and said first conductive region of said information storage transistor is connected to a read line.

2. A semiconductor memory cell according to claim 1, wherein said first conductive region is connected to said second line or said third conductive region via a rectifier junction.

3. A semiconductor memory cell according to claim 2, wherein said first conductive region is formed from a semiconductor as a common region with said second semiconductor channel forming region, said rectifier junction being formed between said common region and said third conductive region, and said first semiconductor channel forming region and said fourth conductive region are formed from a common region.

4. A semiconductor memory cell according to claim 3, wherein said second conductive gate is formed common with said first conductive gate.

5. A semiconductor memory cell according to claim 4, wherein said third conductive region further includes a metal layer or a silicide layer that forms a Schottky junction with said first conductive region.

\* \* \* \* \*